US007261954B2

(12) United States Patent
Thompson et al.

(10) Patent No.: US 7,261,954 B2
(45) Date of Patent: *Aug. 28, 2007

(54) ORGANIC LIGHT EMITTING DEVICES HAVING CARRIER BLOCKING LAYERS COMPRISING METAL COMPLEXES

(75) Inventors: Mark E. Thompson, Anaheim, CA (US); Xiaofan Ren, Los Angeles, CA (US); Vadim Adamovich, Los Angeles, CA (US); Steven R Cordero, Long Beach, CA (US); Brian Wendell D'Andrade, Princeton, NJ (US); Bert Alleyne, Los Angeles, CA (US); Stephen R. Forrest, Princeton, NJ (US)

(73) Assignees: The Trustees of Princeton University, Princeton, NJ (US); The University of Southern California, Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/353,338

(22) Filed: Feb. 13, 2006

(65) Prior Publication Data
US 2006/0134465 A1 Jun. 22, 2006

Related U.S. Application Data

(63) Continuation of application No. 10/226,674, filed on Aug. 23, 2002, now Pat. No. 7,022,421.

(60) Provisional application No. 60/317,541, filed on Sep. 5, 2001, provisional application No. 60/317,540, filed on Sep. 5, 2001, provisional application No. 60/315,527, filed on Aug. 29, 2001.

(51) Int. Cl.
*H01L 51/54* (2006.01)
*H05B 33/12* (2006.01)

(52) U.S. Cl. .................. 428/690; 428/917; 313/504; 313/506

(58) Field of Classification Search ................ 428/690, 428/917; 257/E51.044; 313/504, 506
See application file for complete search history.

(56) References Cited

U.S. PATENT DOCUMENTS

| 4,539,507 | A | 9/1985 | VanSlyke et al. |
|---|---|---|---|
| 4,769,292 | A | 9/1988 | Tang et al. |
| 5,061,569 | A | 10/1991 | VanSlyke et al. |
| 5,141,671 | A | 8/1992 | Bryan et al. |
| 5,294,870 | A | 3/1994 | Tang et al. |
| 5,504,183 | A | 4/1996 | Shi et al. |
| 5,554,220 | A | 9/1996 | Forrest et al. |
| 5,601,903 | A | 2/1997 | Fujii et al. |
| 5,703,436 | A | 12/1997 | Forrest et al. |
| 5,707,745 | A | 1/1998 | Forrest et al. |
| 5,811,833 | A | 9/1998 | Thompson |
| 5,861,219 | A | 1/1999 | Thompson et al. |
| 5,922,396 | A | 7/1999 | Thompson |
| 5,986,401 | A | 11/1999 | Thompson et al. |
| 5,998,803 | A | 12/1999 | Forrest et al. |
| 6,013,982 | A | 1/2000 | Thompson et al. |
| 6,030,715 | A | 2/2000 | Thompson et al. |
| 6,045,930 | A | 4/2000 | Thompson et al. |
| 6,048,630 | A | 4/2000 | Burrows et al. |
| 6,097,147 | A | 8/2000 | Baldo et al. |
| 6,150,043 | A | 11/2000 | Thompson et al. |
| 6,166,489 | A | 12/2000 | Thompson et al. |
| 6,210,814 | B1 | 4/2001 | Thompson et al. |
| 6,245,393 | B1 | 6/2001 | Thompson et al. |
| 6,264,805 | B1 | 7/2001 | Forrest et al. |
| 6,303,238 | B1 | 10/2001 | Thompson et al. |
| 6,310,360 | B1 | 10/2001 | Forrest et al. |
| 6,337,102 | B1 | 1/2002 | Forrest et al. |
| 6,939,624 | B2 * | 9/2005 | Lamansky et al. .......... 428/690 |
| 7,022,421 | B2 * | 4/2006 | Thompson et al. ......... 428/690 |
| 7,078,113 | B2 * | 7/2006 | Thompson et al. ......... 428/690 |
| 2001/0053462 | A1 | 12/2001 | Mishima |
| 2002/0034656 | A1 | 3/2002 | Thompson et al. |
| 2002/0134984 | A1 | 9/2002 | Igarashi |
| 2002/0145380 | A1 | 10/2002 | Aziz |

FOREIGN PATENT DOCUMENTS

| WO | WO98/06242 | 2/1998 |
|---|---|---|
| WO | WO 00/26945 | 5/2000 |
| WO | WO 00/30139 | 5/2000 |
| WO | WO 00/33617 | 6/2000 |
| WO | WO 01/15244 | 3/2001 |

OTHER PUBLICATIONS

Burrows et al., Journal of Applied Physics, vol. 79, No. 10, May 15, 1996, pp. 7991-8006.*
Adachi, et al., "High-efficiency organic electrophosphorescent devices with tris(2-phenylpyridine) iridium doped into electron-transporting materials", App. Phys. Lett., vol. 77, No. 6, pp. 904-906, (Aug. 7, 2000).
Adachi, et al., "High-efficiency red electrophosphorescence devices", App. Phys. Lett., vol. 78, No. 11, pp. 1622-1624 (Mar. 12, 2001).
Adachi, et al., "High efficiency organic light emitting diodes using electrophosphorescence", Am. Phys. Soc., Series II, vol. 46, No. I, Part II, p. 863 (Mar. 2001).

(Continued)

*Primary Examiner*—Dawn L. Garrett
(74) *Attorney, Agent, or Firm*—Kenyon & Kenyon LLP

(57) ABSTRACT

Light emitting devices having blocking layers comprising one or more metal complexes are provided. The blocking layers may serve to block electrons, holes, and/or excitons. Preferably, the devices further comprise a separate emissive layer in which charge and/or excitons are confined. Metal complexes suitable for blocking layers can be selected by comparison of HOMO and LUMO energy levels of materials comprising adjacent layers in devices of the present invention.

47 Claims, 26 Drawing Sheets

OTHER PUBLICATIONS

Baldo, et al., "Highly efficient phosphorescent emission from organic electroluminescent devices," Nature, Sep. 1998, vol. 395, pp. 151-154.

Baldo, et al., "Very high-efficiency green organic light-emitting devices based on electrophosphorescence", Applied Physics Letters, vol. 75, No. 1, pp. 4-6, Jul. 5, 1999.

Baldo, et al., "Excitonic singlet-triplet ratio in a semiconducting organic thin film", Phys. Rev., B vol. 60, No. 20, pp. 14422-14428 (Nov. 15, 1999).

Burroughs, et al., "Light Emitting Diodes based on conjugated Polymers", Nature, 1990, 347, 539-41.

Elliot, et al., "Highly Efficient Solid-State Electrochemically Generated Chemiluminescence from Ester-Substituted Trisbipyridineruthenium (II)-based Polymers", J. Am. Chem. Soc., 1998 120, 6781-6784.

Gao, et al., "Solid-State Organice Light Emitting Diodes based on Tris (2,2'-bipyridine) ruthenium (II) complexes", J. Am. Chem. Soc. 2000, 122, 7426-7.

Wu et al., "Solid-State Light Emitting Devices based on the Tris-Chelated Ruthenium (II) Complex: 3. High Efficiency Devices via a Layer-by-layer Molecular -Level Blending Approach", J. Am. Chem. Soc. 1999, 121, 4883-4891.

Kijima, et al., "A Blue Organic Light Emitting Diod", Jpn. J. Appl. Phys. 1999, 38, 5274-5277.

Lyons, et al., "Solid-State Light Emitting Devies Based on the Trischelated Ruthenium (II) Complex. 1. Thin Film Blends with Poly(ethylene oxide)", J. Am. Chem. Soc. 1998, 120, 12100-12107.

Maness, et al., "Solid State Electrochemically generated Luminescence Based on Serial Frozen Concentration Gradients of Ru III/II and Ru II/I Couples in a Molten Ruthenium 2,2'-Bipyridine Complex", J. Am. Chem. Soc. 1997, 119, 3987-3993.

Miessler, et al., "Introduction to Inorganic Chemistry", Inorganic Chemistry, 1999, $2^{nd}$ Edition, 1-3, 422-424.

D.F. O'Brien, et al., "Improved energy transfer in electrophosphorescent devices", *Applied Physics Letters*, vol. 74, No. 3, pp. 442-444, (Jan. 18, 1999).

Kwong et al., "Organic Light-Emitting Devices Based on Phosphorescent Hosts and Dyes," Advanced Materials, vol. 12, No. 15, pp. 1134-1138 (2000).

Tang, et al., "Organic electroluminescent diodes", Appl. Phys. Lett., 1987, 51, 913-915.

Wang, et al., "Highly efficient eletroluminescent materials based on fluorinated organometallic iridium compounds", Appl. Phys. Lett. 2001, 79(4): 449-451.

Watanabe, et al., "Optimization of driving lifetime durability in organic LED devices using Ir complex", Organic Light Emitting Materials and Devies IV, 2001, 4105, 175.

* cited by examiner mer-Irppy
Meridianal isomer fac-Irppy
Facial isomer

BTPIr

PQIr

BSNIr

BTIr

FIGURE 9

| Device structure | CIE | Color | V turn on 0.2Cd/m² | V at 100 Cd/m² | Max q.e. % | @V |
|---|---|---|---|---|---|---|
| NPD (400Å)<br>CBP:FIrpic 6% (200Å)<br>FIrPic (100Å)<br>BCP (100Å)<br>Alq₃ (200Å) | 0.19 0.29 | Aqua | 4.1 | 7.1 | 0.71 | 7.1 |
| NPD (400Å)<br>CBP:FIrpic 6% (300Å)<br>FIRPIC (200Å)<br>Alq₃ (200Å) | 0.22 0.37 | Aqua-Greenish | 3.8 | 6.2 | 0.57 | 6.8 |
| NPD (400Å)<br>CBP:FIrpic 6% (300Å)<br>BCP (200Å)<br>Alq₃ (200Å) | 0.16 0.23 | Aqua-Bluish | 4.5 | 7.2 | 0.58 | 7.7 |

FIGURE 10A
FIGURE 10B
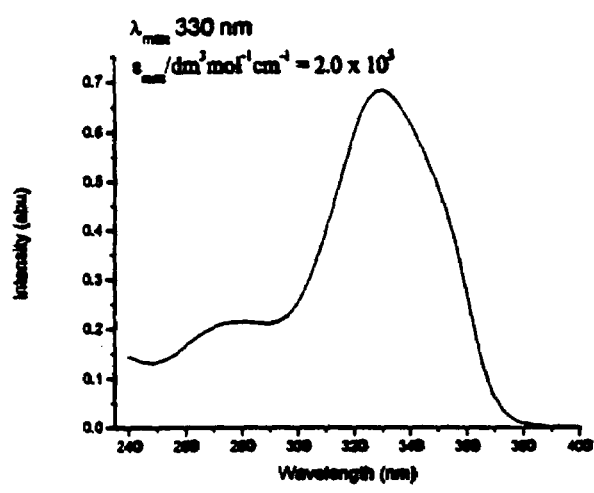
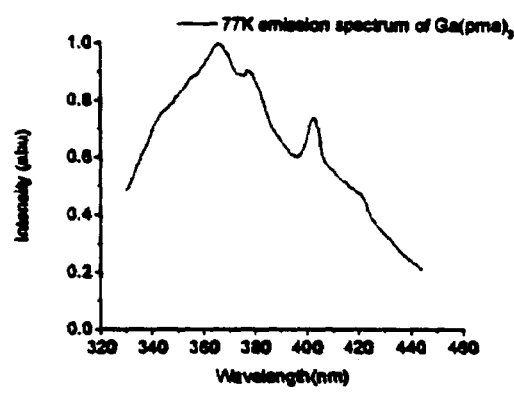

I-V characteristics for NPD and Co(ppz)$_3$/Ga(mpa)$_3$ based OLEDs. Device structure: ITO/HTL(500Å)/CBP:Irppy(6% 200Å)/BCP(150Å)/Alq$_3$(200Å)/LiF/Al Brightness versus voltage for devices of Figure 7.

Quantum efficiency versus current density for the devices of Figure 7.

Emission spectra for the devices of Figure 7.

Materials used as HBL

A) TPBi, PBD, TAZ

B) Polyquinolines
Oxidazole-containing molecules
Carbon nanotubes (doped into PPV)

C) BCP BAlq

Materials as a host and dopant for HBL

Host should be wide band-gap (invisible) material:

- OPCOT (octaphenyl cyclooctatetraene)
  $E_{bg}$ 3.3eV

- Sexiphenyls $E_{bg}$ 3.64 eV $E_{bg}$ 3.58 eV

Dopant should have appropriate HOMO and LUMO levels:

- Firpic

LUMO 2.87eV
HOMO 5.81eV (4,6-F$_2$ppy)$_2$Ir(pic)

- Potentially a lot of other complexes

| HBL | V turn on | V at 100 Cd/m² | Max q.e., % | @V |
|---|---|---|---|---|
| BCP(150Å) | 3.5 | 4.0 | 2.7 | 7.0 |
| FirPic(150Å) | 2.9 | 3.7 | 4.1 | 5.4 |
| OPCOT:FirPic(15%)(150Å) | 4.0 | 4.5 | 1.7 | 7.0 |

ORGANIC LIGHT EMITTING DEVICES HAVING CARRIER BLOCKING LAYERS COMPRISING METAL COMPLEXES

CROSS REFERENCE TO RELATED APPLICATIONS

This application is a continuation of co-pending U.S. patent application Ser. No. 10/226,674, filed Aug. 23, 2002, now U.S. Pat. No. 7,022,421 which claims the benefit of U.S. Provisional Patent Application No. 60/315,527, filed Aug. 29, 2001, and U.S. Provisional Patent Application No. 60/317,540, filed Sep. 5, 2001, which are incorporated herein in their entirety. This application is also related to co-pending U.S. Provisional Application No. 60/317,541, filed Sep. 5, 2001, which is incorporated herein by reference in its entirety

GOVERNMENT RIGHTS

The U.S. Government has a paid-up license in this invention and the right in limited circumstances to require the patent owner to license others on reasonable terms as provided for by the terms of Contract No. F33615-94-1-1414 awarded by DARPA.

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of agreement.

FIELD OF THE INVENTION

The present invention is directed to light emitting devices incorporating metal complexes for improved efficiency and stability.

BACKGROUND OF THE INVENTION

Electronic display currently is a primary means for rapid delivery of information. Television sets, computer monitors, instrument display panels, calculators, printers, wireless phones, handheld computers, etc. aptly illustrate the speed, versatility, and interactivity that is characteristic of this medium. Of the known electronic display technologies, organic light emitting devices (OLEDs) are of considerable interest for their potential role in the development of full color, flat-panel display systems that may render obsolete the bulky cathode ray tubes still currently used in many television sets and computer monitors.

Generally, OLEDs are comprised of several organic layers in which at least one of the layers can be made to electroluminesce by applying a voltage across the device (see, e.g., Tang, et al., *Appl. Phys. Lett.* 1987, 51, 913 and Burroughes, et al., *Nature,* 1990, 347, 359). When a voltage is applied across a device, the cathode effectively reduces the adjacent organic layers (i.e., injects electrons) whereas the anode effectively oxidizes the adjacent organic layers (i.e., injects holes). Holes and electrons migrate across the device toward their respective oppositely charged electrodes. When a hole and electron meet on the same molecule, recombination is said to occur and an exciton is formed. Recombination of the hole and electron is preferably accompanied by radiative emission, thereby producing electroluminescence.

Depending on the spin states of the hole and electron, the exciton which results from hole and electron recombination can have either a triplet or singlet spin state. Luminescence from a singlet exciton results in fluorescence whereas luminescence from a triplet exciton results in phosphorescence. Statistically, for organic materials typically used in OLEDs, about one quarter of the excitons are singlets and the remaining three quarters are triplets (see, e.g., Baldo, et al., *Phys. Rev. B,* 1999, 60, 14422). Until the discovery that there were certain phosphorescent materials that could be used to fabricate practical electro-phosphorescent OLEDs having a theoretical quantum efficiency of up to 100% (i.e., harvesting all of both triplets and singlets), the most efficient OLEDs were typically based on materials that fluoresced. These materials fluoresced with a maximum theoretical quantum efficiency of only 25% (where quantum efficiency of an OLED refers to the efficiency with which holes and electrons recombine to produce luminescence), since the triplets to ground state transition is formally a spin forbidden process. Electro-phosphorescent OLEDs have now been show to have superior overall device efficiencies as compared with electro-fluorescent OLEDs (see, e.g., Baldo, et al., *Nature,* 1998, 395, 151 and Baldo, e.g., *Appl. Phys. Lett.* 1999, 75(3), 4).

Typically, OLEDs contain several thin organic layers between a hole injecting anode layer, comprising an oxide material, such as indium-tin oxide (ITO), Zn—In—$SnO_2$, $SbO_2$, or the like, and an electron injecting cathode layer, comprising a metal layer, such as Mg, Mg:Ag, or LiF:Al. An organic layer residing in proximity to the anode layer is usually referred to as the "hole transporting layer" (HTL) due to its propensity for conducting positive charge (i.e., holes). Various compounds have been used as HTL materials. The most common materials consist of various triaryl amines which show high hole mobilities. Similarly, the organic layer residing in proximity to the cathode layer is referred to as the "electron transporting layer" (ETL) due to its propensity to conduct negative charge (i.e., electrons). There is somewhat more variety in the ETL materials used in OLEDs as compared with for the HTL. A common ETL material is aluminum tris(8-hydroxyquinolate) ($Alq_3$). Collectively, the ETL and HTL are often referred to as carrier layers. In some cases, an additional a layer may be present for enhancing hole or electron injection from the electrodes into the HTL or ETL, respectively. These layers are often referred to as hole injecting layers (HILs) or electron injecting layer (EIL). The HIL may be comprised of a small molecule, such as 4,4',4"-tris(30methylphenylphenylamino)triphenylamine (MTDATA) or polymeric material, such as poly(3,4-ethylenedioxythiophene) (PEDOT). The EIL may be comprised of a small molecule material, such as, e.g., copper phthalocyanine (CuPc). Many OLEDs further comprise an emissive layer (EL), or alternatively termed, luminescent layer, situated between the ETL and HTL, where electroluminescence occurs. Doping of the luminescent layer with various luminescent materials has allowed fabrication of OLEDs having a wide variety of colors.

In addition to the electrodes, carrier layers, and luminescent layer, OLEDs have also been constructed with one or more blocking layers to help maximize efficiency. These layers serve to block the migration of holes, electrons, and/or excitons from entering inactive regions of the device. For example, a blocking layer that confines holes to the luminescent layer effectively increases the probability that holes will result in a photoemissive event. Hole blocking layers desirably have a deep (i.e., low) HOMO energy level (characteristic of materials that are difficult to oxidize) and conversely, electron blocking materials generally have a high LUMO energy level. Exciton blocking materials have also been shown to increase device efficiencies. Triplet excitons, which are relatively long-lived, are capable of migrating about 1500 to 2000 Å, which is sometimes greater than the entire width of the device. An exciton blocking layer, comprising materials that are characterized by a wide band gap, can serve to block loss of excitons to non-emissive regions of the device.

In seeking greater efficiencies, devices have been experimentally created with layers containing light emitting metal complexes. Functional OLEDs having emissive layers of tris(2,2'-bipyridine)ruthenium(II) complexes or polymer derivatives thereof have been reported in Gao, et al., *J. Am. Chem. Soc.*, 2000, 122, 7426, Wu, et al., *J. Am. Chem. Soc.* 1999, 121, 4883, Lyons, et al., *J. Am. Chem. Soc.* 1998, 120, 12100, Elliot, et al., *J. Am. Chem. Soc.* 1998, 120, 6781, and Maness, et al., *J. Am. Chem. Soc.* 1997, 119, 3987. Iridium-based and other metal-containing emitters have been reported in, e.g., Baldo, et al., *Nature,* 1998, 395, 151; Baldo, et al., *Appl. Phys. Lett.,* 1999, 75, 4; Adachi, et al., *Appl. Phys. Lett.,* 2000, 77, 904; Adachi, et al., *Appl. Phys. Lett.,* 2001, 78, 1622; Adachi, et al., *Bull. Am. Phys. Soc.* 2001, 46, 863, Wang, et al., *Appl. Phys. Lett.,* 2001, 79, 449 and U.S. Pat. Nos. 6,030,715; 6,045,930; and 6,048,630. Emissive layers containing (5-hydroxy)quinoxaline metal complexes as host material has also been described in U.S. Pat. No. 5,861,219. Efficient multicolor devices and displays are also described in U.S. Pat. No. 5,294,870 and International Application Publication No. WO 98/06242.

A metal-containing blocking layer has also been reported. Specifically, (1,1'-biphenyl)-4-olato)bis(2-methyl-8-quinolinolato N1,O8)aluminum (BAlq) has been used as a blocking layer in the OLEDs reported in Watanabe, et al. "Optimization of driving lifetime durability in organic LED devices using Ir complex," in *Organic Light Emitting Materials and Devices IV,* Kafafi, ed. Proceedings of SPIE Vol. 4105, p. 175 (2001).

Although OLEDs promise new technologies in electronic display, they often suffer from degradation, short life spans, and loss of efficiency over time. The organic layers can be irreversibly damaged by sustained exposure to the high temperatures typically encountered in devices. Multiple oxidation and reduction events can also cause damage to the organic layers. Consequently, there is a need for the development of new materials for the fabrication of OLEDs. Compounds that are stable to both oxidation and reduction, have high $T_g$ values, and readily form glassy thin films are desirable. The invention described hereinbelow helps fulfill these and other needs.

SUMMARY OF THE INVENTION

The present invention provides, inter alia, light emitting devices comprising at least one blocking layer, wherein the blocking layer includes at least one transition metal complex.

In some embodiments, the blocking layer does not electroluminescence in said device. In other embodiments, the blocking layer is a hole blocking layer, an electron blocking layer, or an exciton blocking layer. The blocking layer can consist essentially of said transition metal complex. Further, the transition metal can be a second or third row transition metal, such as iridium. The metal complex can also be bis(2-(4,6-difluorophenyl)pyridyl-N, C2 ')iridium(III) picolinate.

The present invention further provides light emitting devices comprising at least one blocking layer, wherein the blocking layer comprises at least one metal complex comprising a main group metal atom having an atomic number greater than 13. In some embodiments, the blocking layer can be hole blocking layer, an electron blocking layer, or an exciton blocking layer. In some embodiments, the blocking layer consists essentially of said metal complex. The main group metal atom can be a third, fourth, or fifth main group metal atom, such as gallium. Further, the metal complex can be gallium(III)tris[2-(((pyrrole-2-yl)methylidene)amino) ethyl]amine.

According to other aspects, the present invention provides light emitting devices comprising at least one blocking layer, wherein the blocking layer includes at least one metal complex comprising a main group metal atom, wherein the complex is six-coordinate.

In further aspects, the present invention provides light emitting devices comprising at least one blocking layer, wherein the blocking layer includes at least one metal complex, and wherein the metal complex comprises aluminum and is not BAlq.

Also provided by the present invention are light emitting devices comprising a blocking layer, wherein the blocking layer includes a wide band-gap organic matrix into which a metal complex is doped. In some embodiments, the wide band-gap organic matrix is doped with about 1 to about 50% by weight of metal complex. In further embodiments, the organic matrix can comprise octaphenyl cyclooctatetraene or oligophenyl.

In still further embodiments, the present invention provides light emitting devices comprising at least one blocking layer comprising a compound of formula III:

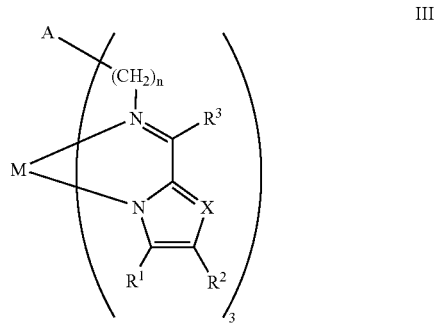

III wherein:

M is a metal atom;

X is N or CX' where X' is H, $C_1$-$C_{20}$ alkyl, $C_2$-$C_{40}$ mono- or poly alkenyl, $C_2$-$C_{40}$ mono- or poly alkynyl, $C_3$-$C_8$ cycloalkyl, aryl, heteroaryl, aralkyl, heteroaralkyl, or halo;

A is CH, CX', N, P, P(=O), aryl or heteroaryl;

each $R^1$ and $R^2$ is, independently, H, $C_1$-$C_{20}$ alkyl, $C_2$-$C_{40}$ alkenyl, $C_2$-$C_{40}$ alkynyl, $C_3$-$C_8$ cycloalkyl, aryl, aralkyl, or halo; or $R^1$ and $R^2$, together with the carbon atoms to which they are attached, link to form a fused $C_3$-$C_8$ cycloalkyl or aryl group;

R³ is H, $C_1$-$C_{20}$ alkyl, $C_2$-$C_{40}$ alkenyl, $C_2$-$C_{40}$ alkynyl, $C_3$-$C_8$ cycloalkyl, aryl aralkyl, or halo; and n is 1 to 5. In some embodiments, M is Al or Ga. In further embodiments, R¹ and R² are linked to form a fused phenyl group. In further embodiments, A is N.

In further aspects, the invention provides light emitting devices comprising an emissive layer and a hole blocking layer, each of said layers having an anode side and a cathode side, wherein said cathode side of said emissive layer is in contact with said anode side of said hole blocking layer, wherein said hole blocking layer has a lower HOMO energy level than the HOMO energy level of said emissive layer and comprises at least one transition metal complex. In some embodiments, the magnitude of the difference between the LUMO energy levels of the hole blocking layer and the emissive layer is less than the magnitude of the difference between the HOMO energy levels of the hole blocking layer and the emissive layer. In further embodiments, the hole blocking layer consists essentially of said metal complex. In further embodiments, the emissive layer comprises a host material doped with an emitter. In yet further embodiments, the hole blocking layer comprises a wide band-gap organic matrix doped with said metal complex. In some embodiments, the doped metal complex has a smaller band-gap than the matrix. In further embodiments, the LUMO energy level of the doped metal complex is less than about 200 meV from the LUMO energy level of the emissive layer. In further aspects, the emitter is a metal complex.

The present invention further provides light emitting devices comprising an emissive layer and a hole blocking layer, each of said layers having an anode side and a cathode side, wherein said cathode side of said emissive layer is in contact with said anode side of said hole blocking layer, wherein said hole blocking layer has a lower HOMO energy level than the HOMO energy level of said emissive layer and comprises at least one metal complex comprising a main group metal atom having an atomic number greater than 13.

The present invention further provides light emitting devices comprising an emissive layer and a hole blocking layer, each of said layers having an anode side and a cathode side, wherein said cathode side of said emissive layer is in contact with said anode side of said hole blocking layer, wherein said hole blocking layer has a lower HOMO energy level than the HOMO energy level of said emissive layer and comprises at least one six-coordinate metal complex.

The present invention further provides light emitting devicse comprising an emissive layer and a hole blocking layer, each of said layers having an anode side and a cathode side, wherein said cathode side of said emissive layer is in contact with said anode side of said hole blocking layer, wherein said hole blocking layer has a lower HOMO energy level than the HOMO energy level of said emissive layer and comprises at least one metal complex comprising aluminum, wherein said metal complex is not Balq.

The present invention further provides light emitting devices comprising an emissive layer and an electron blocking layer, each of said layers having an anode side and a cathode side, wherein said anode side of said emissive layer is in contact with said cathode side of said electron blocking layer, wherein said electron blocking layer has a higher LUMO energy level than the LUMO energy level of said emissive layer and comprises at least one metal complex. In some embodiments, the magnitude of the difference between the HOMO energy levels of the electron blocking layer and the emissive layer is less than the magnitude of the difference between the LUMO energy levels of said hole blocking layer and the emissive layer. In other embodiments, the electron blocking layer has a HOMO energy level that is less than about 200 meV from the HOMO energy level of the emissive layer. In yet further embodiments, the electron blocking layer consists essentially of said metal complex. In other embodiments, the emissive layer comprises a host material doped with an emitter. In yet further embodiments, the electron blocking layer comprises a wide-band gap organic matrix doped with the metal complex. In some embodiments, the doped metal complex has a smaller band-gap than the matrix. In further embodiments, the HOMO energy level of the doped metal complex is less than about 200 meV from the HOMO energy level of the emissive layer.

In yet other embodiments, the present invention provides light emitting devices comprising an emissive layer and an exciton blocking layer, wherein the emissive layer is in contact with the exciton blocking layer, wherein the exciton blocking layer has a wider optical gap than the optical gap of the emissive layer, and wherein the exciton blocking layer comprises at least one metal complex. In some embodiments, the exciton blocking layer has a HOMO energy level that is less than about 200 meV from the HOMO energy level of said emissive layer. In further embodiment, the exciton blocking layer has a LUMO energy level that is less than about 200 meV from the LUMO energy level of said emissive layer. In other embodiments, said exciton blocking layer consists essentially of said metal complex.

The present invention further provides light emitting devices having the structure anode/HTL/EL/HBL/ETL/cathode wherein the HBL comprises a wide band-gap organic matrix doped with a metal complex.

The present invention further provides light emitting devices having the structure anode/HTL/EBL/EL/ETL/cathode wherein the EBL comprises a wide band-gap organic matrix doped with a metal complex.

The present invention further provides methods of confining holes to an emissive layer in a light emitting device, wherein the emissive layer comprises an anode side and a cathode side, and wherein the device comprises a blocking layer adjacent to the cathode side of said emissive layer, where the blocking layer has a lower HOMO energy level than the HOMO energy level of the emissive layer and comprises at least one transition metal complex.

In further aspects, the invention provides methods of confining holes to an emissive layer in a light emitting device, wherein the emissive layer comprises an anode side and a cathode side, and wherein the device comprises a blocking layer adjacent to the cathode side of the emissive layer, where the blocking layer has a lower HOMO energy level than the HOMO energy level of the emissive layer and comprises at least one metal complex comprising a main group metal atom having an atomic number greater than 13.

In still further aspects, the invention provides methods of confining holes to an emissive layer in a light emitting device, wherein the emissive layer comprises an anode side and a cathode side, and wherein the device comprises a blocking layer adjacent to said cathode side of said emissive layer, where the blocking layer has a lower HOMO energy level than the HOMO energy level of the emissive layer and comprises at least one six-coordinate metal complex.

In still further aspects, the invention provides methods of confining holes to an emissive layer in a light emitting device, wherein the emissive layer comprises an anode side and a cathode side, and wherein the device comprises a blocking layer adjacent to the cathode side of said emissive layer, where the blocking layer has a lower HOMO energy level than the HOMO energy level of the emissive layer and comprises at least one metal complex comprising aluminum, wherein the metal complex is not BAlq.

In still further aspects, the invention provides methods of confining electrons to an emissive layer in a light emitting device, wherein the emissive layer comprises an anode side and a cathode side, and wherein the device comprises a blocking layer adjacent to the cathode side of the emissive layer, where the blocking layer has a higher LUMO energy level than the LUMO energy level of the emissive layer and comprises at least one metal complex. The method preferably comprises applying a voltage across such a device.

The present invention further provides methods of confining excitons to an emissive layer in a light emitting device, wherein the emissive layer is in contact with the exciton blocking layer, wherein the exciton blocking layer has a wider optical gap than the optical gap of the emissive layer, and wherein the exciton blocking layer comprises at least one metal complex, the methods comprising applying a voltage across the device.

In further aspects, the invention provides methods of fabricating a light emitting device, the methods comprising depositing a blocking layer onto a preexisting layer wherein the blocking layer comprises a compound of formula III as described above. In some embodiments, the compound is Ga(pma)$_3$.

In yet another aspect, the present invention provides methods of fabricating a light emitting device, the methods comprising depositing a blocking layer onto a preexisting layer, wherein the blocking layer comprises a metal complex comprising iridium. In some embodiments, the metal complex is FIrpic.

In some embodiments of the foregoing devices and methods, the blocking layer consists essentially of the metal complex. In further embodiments of the foregoing devices and methods, the blocking layer comprises an organic matrix doped with the metal complex, preferably wherein the organic matrix is a wide band-gap organic matrix.

In further aspects, the invention provides pixels and displays comprising the light emitting devices described herein.

BRIEF DESCRIPTION OF THE DRAWINGS

FIG. 9 compares properties of devices of the structure NPD/CBP:FIrpic/HBL/Alq$_3$.

FIGS. 10A-10B show electronic spectra for Ga(pma)$_3$.

DETAILED DESCRIPTION OF PREFERRED EMBODIMENTS

Figure 1:
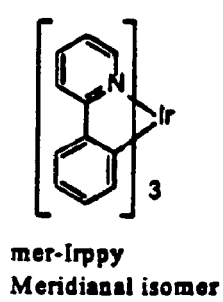
FIG. 1 portrays several iridium compounds suitable for preparing devices of the present invention.
Figure 1:
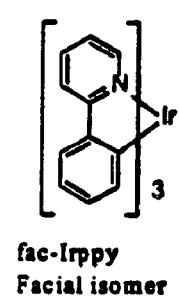
Figure 1:
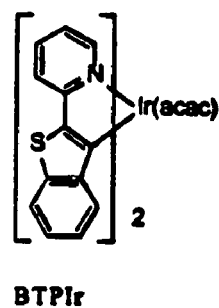
Figure 1:
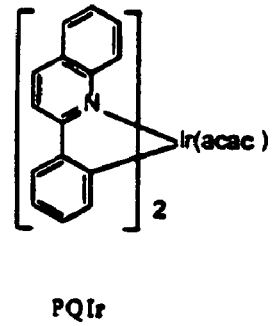
Figure 1:
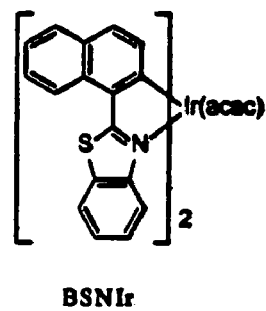
Figure 1:
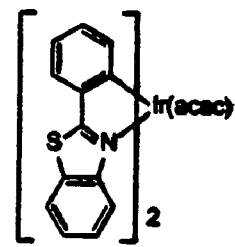
Figure 2:
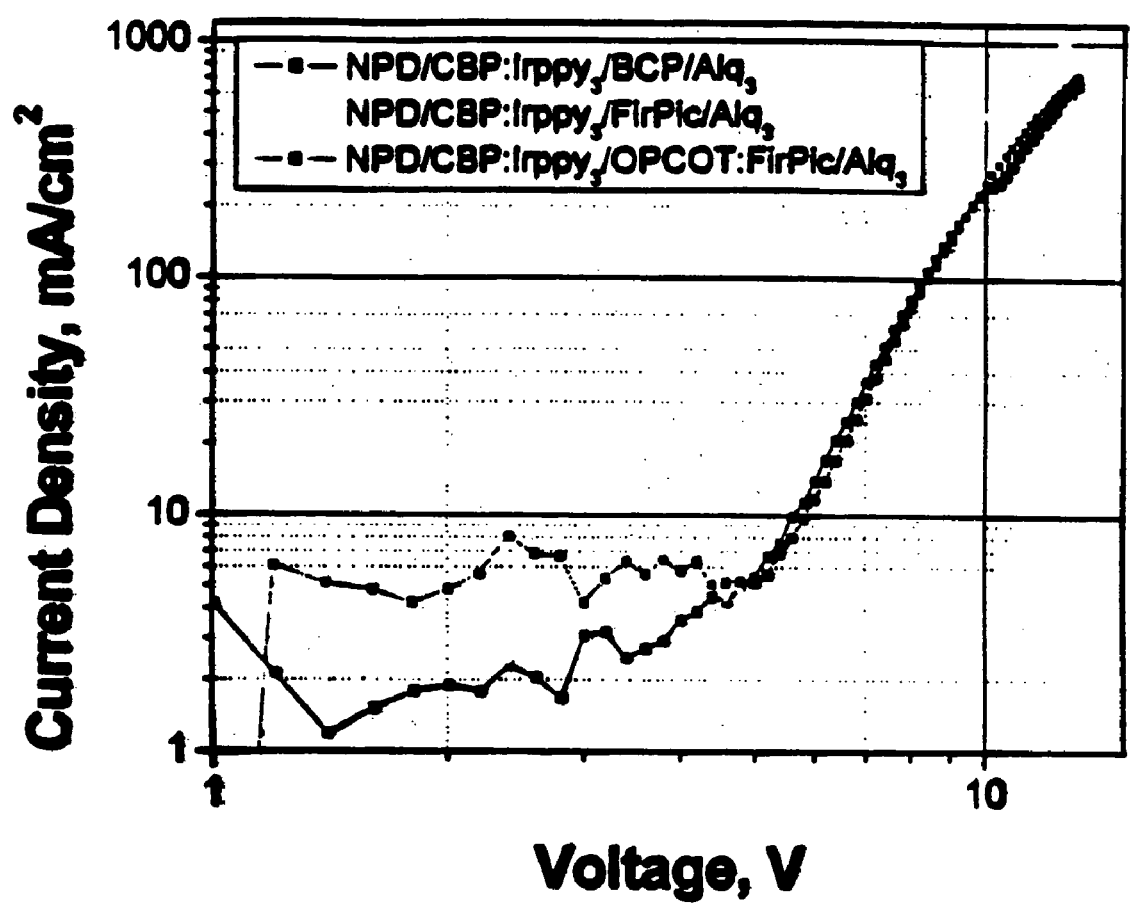
FIG. 2 shows current v. voltage plots for devices of the structure ITO/NPD(400 Å)/CBP:Irppy$_3$(6% 200 Å)(facial)/HBL(150 Å)/Alq$_3$(200 Å)/Mg:Ag.
Figure 3A:
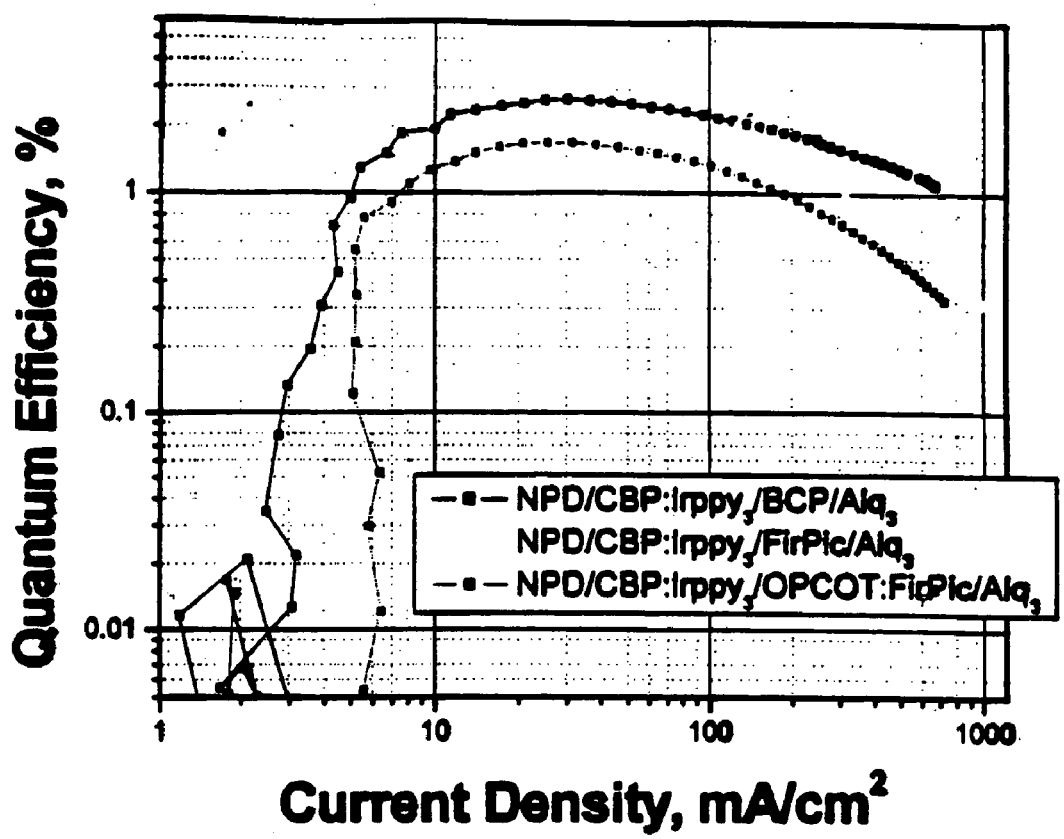
FIGS. 3A-3B show quantum efficiency v. current density and normalized EL v. wavelength plots for devices of the structure ITO/NPD(400 Å)/CBP:Irppy$_3$(6% 200 Å)(facial)/HBL(150 Å)/Alq$_3$(200 Å)/Mg:Ag.
Figure 3B:
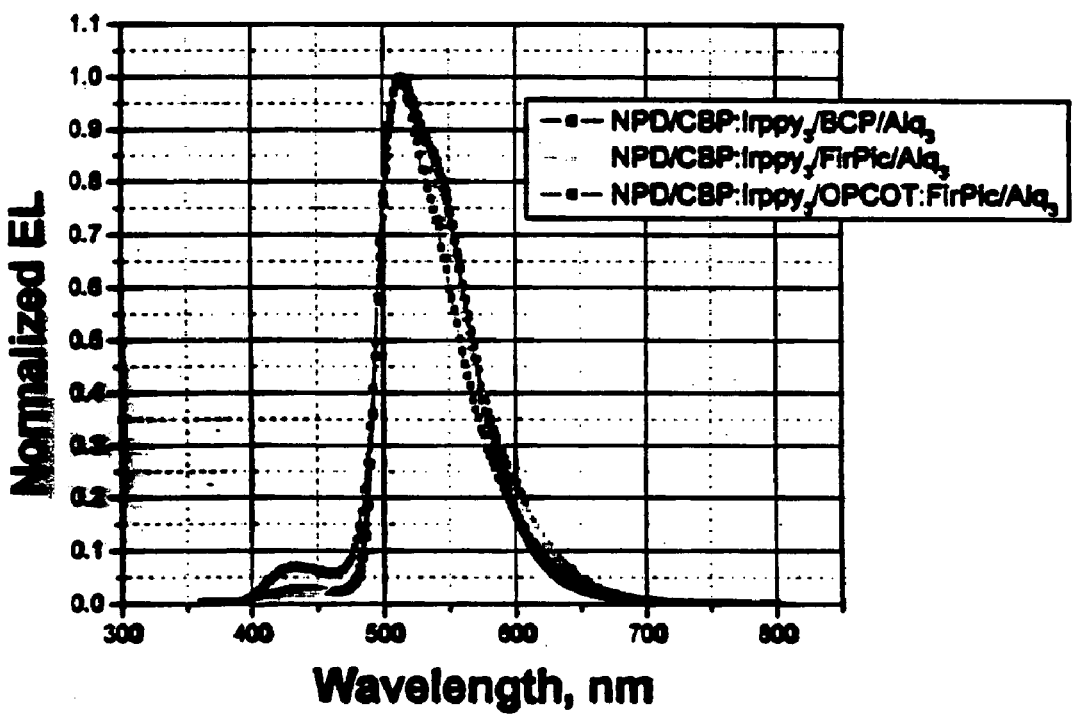
Figure 4:
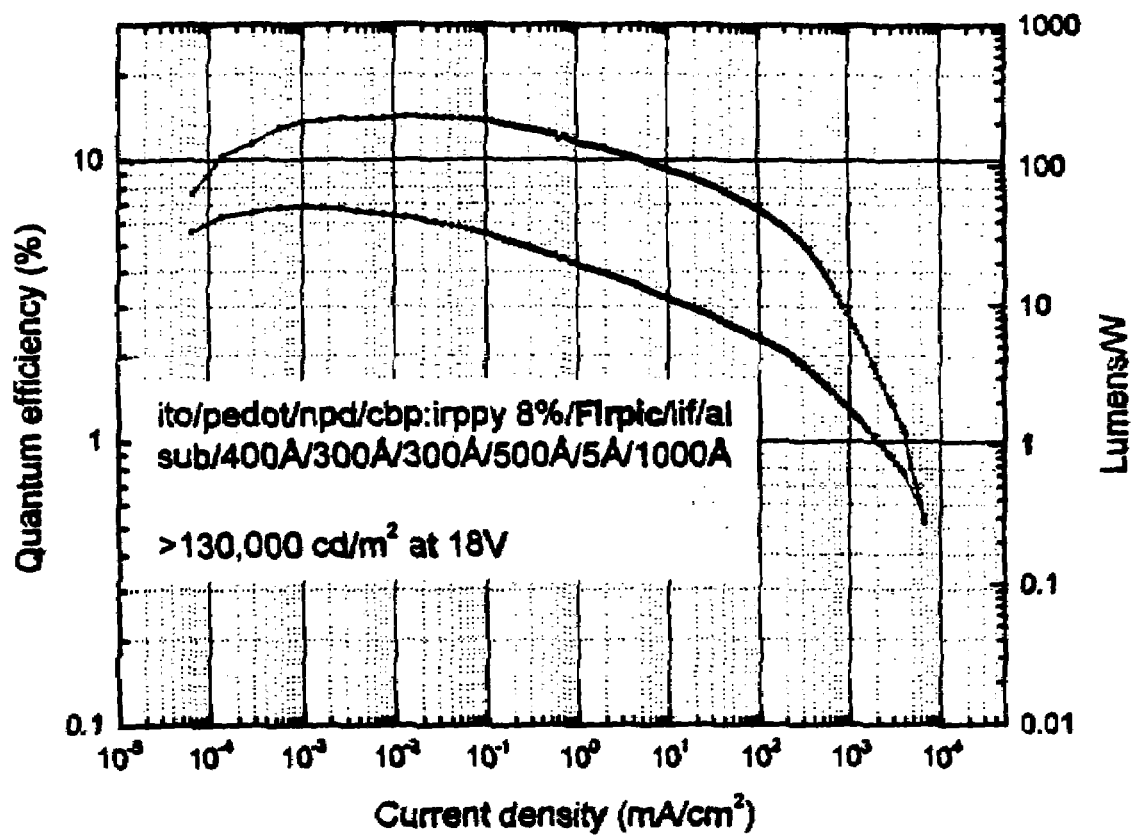
FIG. 4 shows quantum efficiency v. current density (lower) and lumens v. current density (upper) plots for a device having a FIrpic blocking layer.
Figure 5:
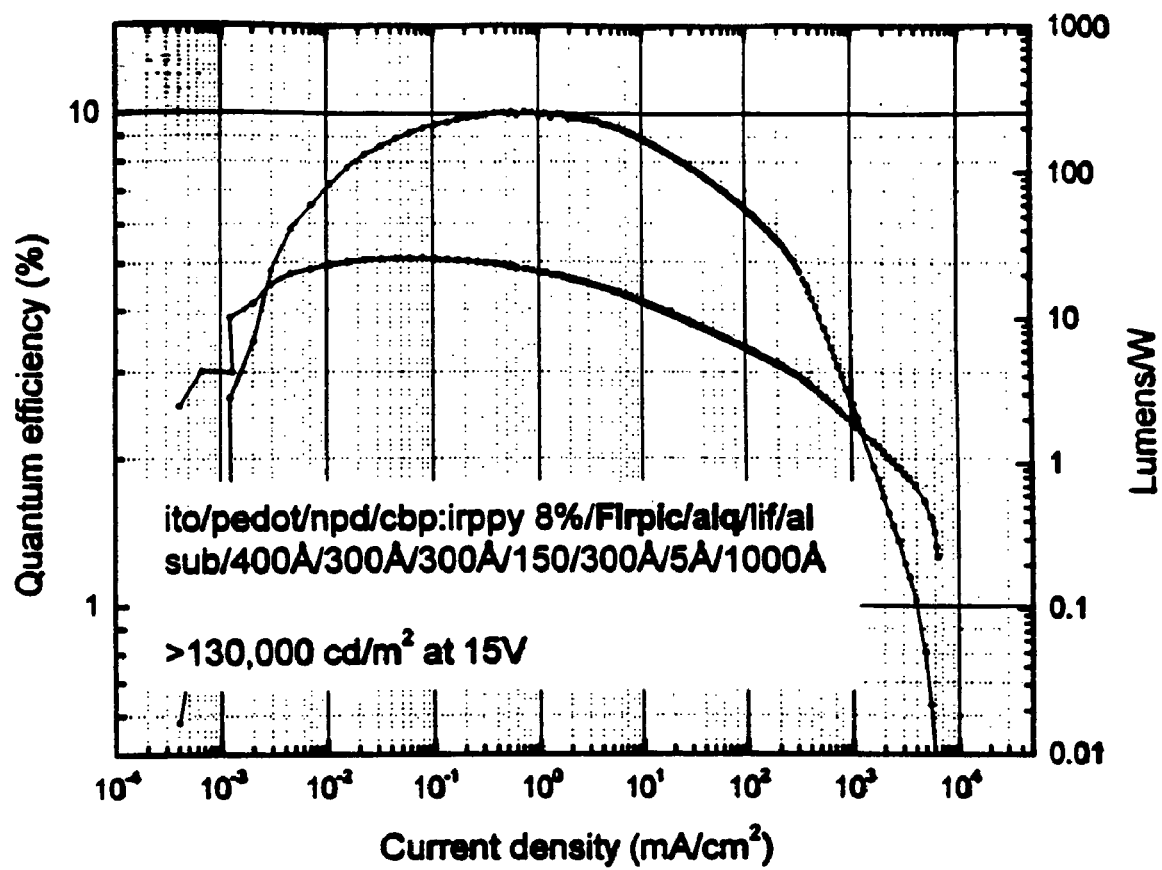
FIG. 5 shows quantum efficiency v. current density (lower) and lumens v. current density (upper) plots for a device having a FIrpic blocking layer.
Figure 6:
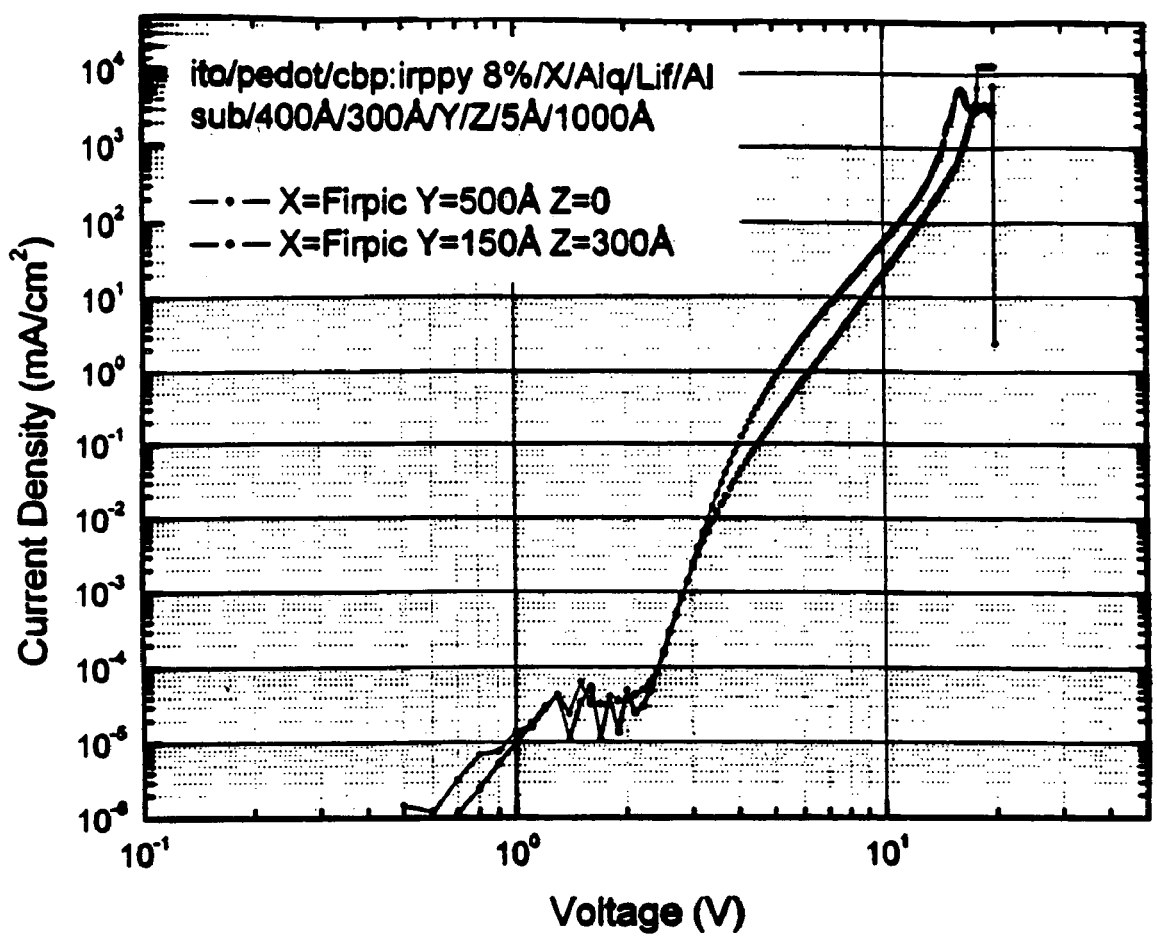
FIG. 6 shows current density v. voltage plots for devices having a FIrpic blocking layer.
Figure 7:
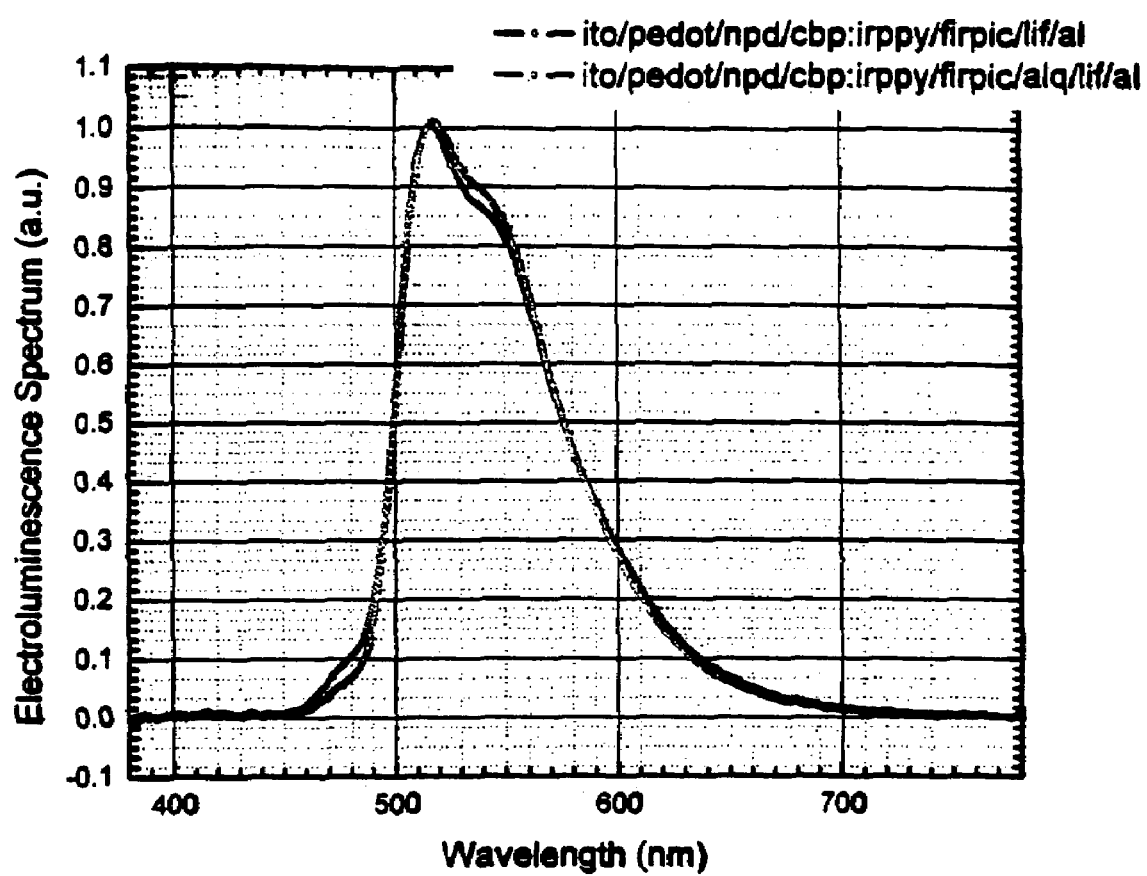
FIG. 7 shows the electroluminescence spectrum for devices having a FIrpic blocking layer.
Figure 8A:
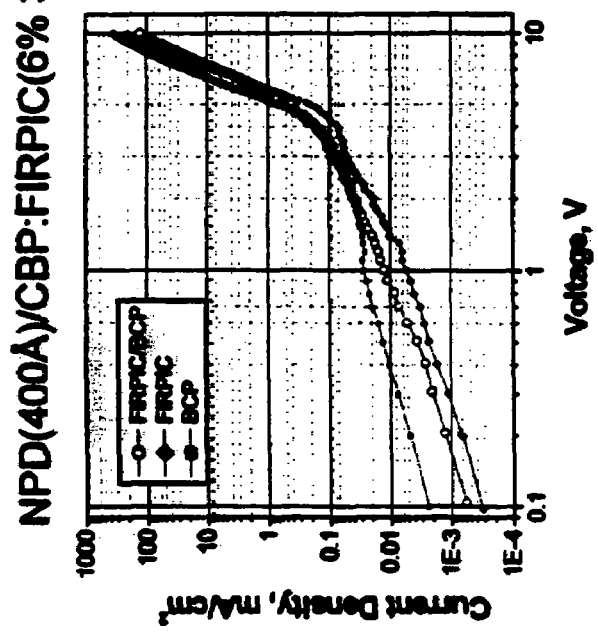
FIGS. 8A-8D show plots comparing properties of devices of the structure NPD(400 Å)/CBP:FIrpic(6%)(300 Å)/HBL(200 Å)/Alq$_3$(200 Å)/Mg:Ag.
Figure 8B:
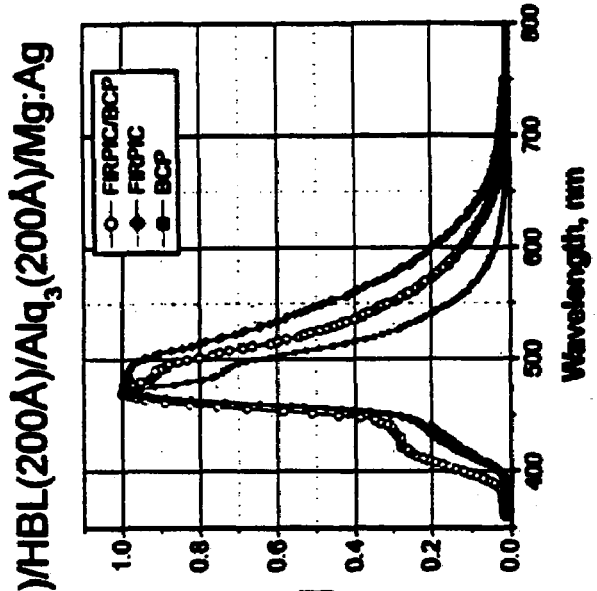
Figure 8C:
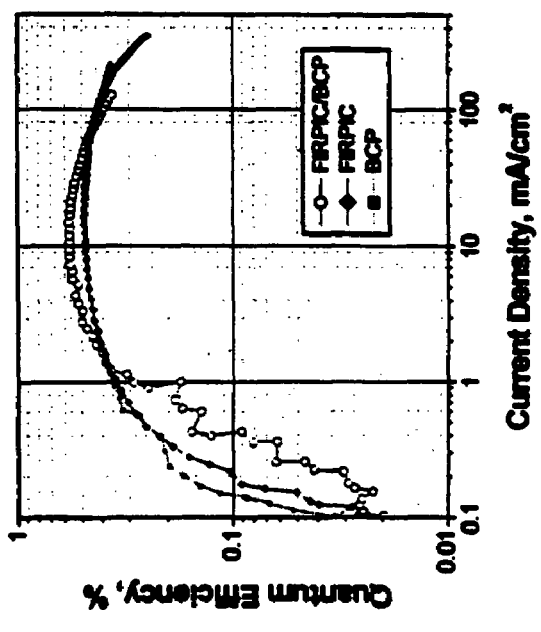
Figure 8D:
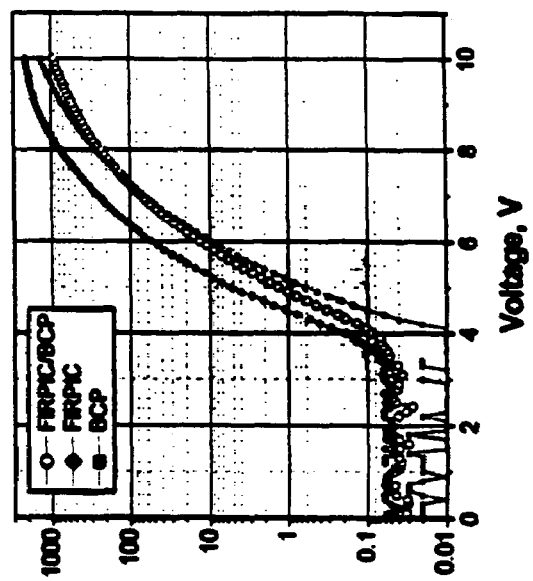
Figure 11:
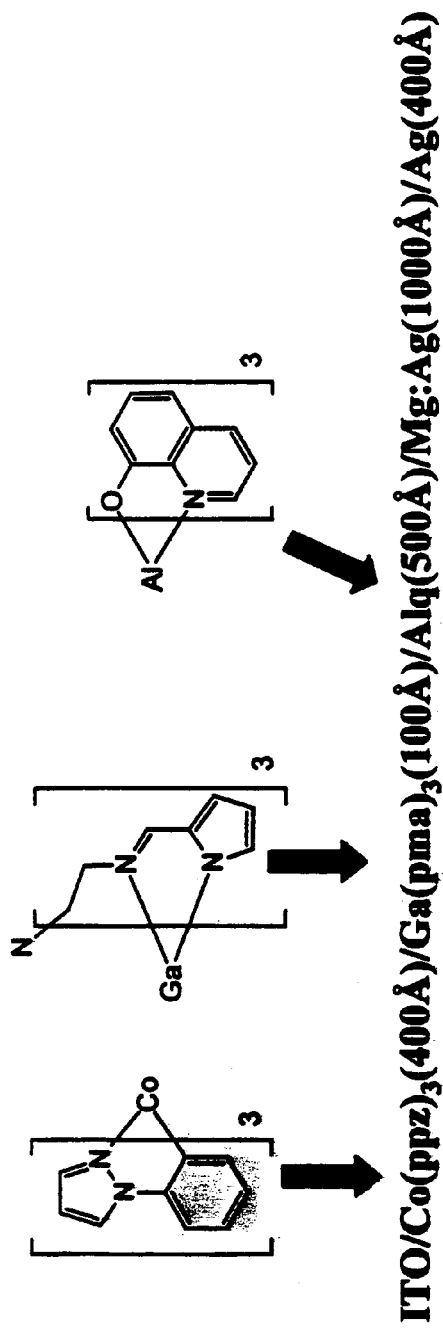
FIG. 11 shows a current density v. voltage plot for a device having the structure ITO/Co(ppz)$_3$(400 Å)/Ga(Pma)$_3$ (100 Å)/Alq$_3$(500 Å)/MgAg(1000 Å)/Ag.
Figure 11:
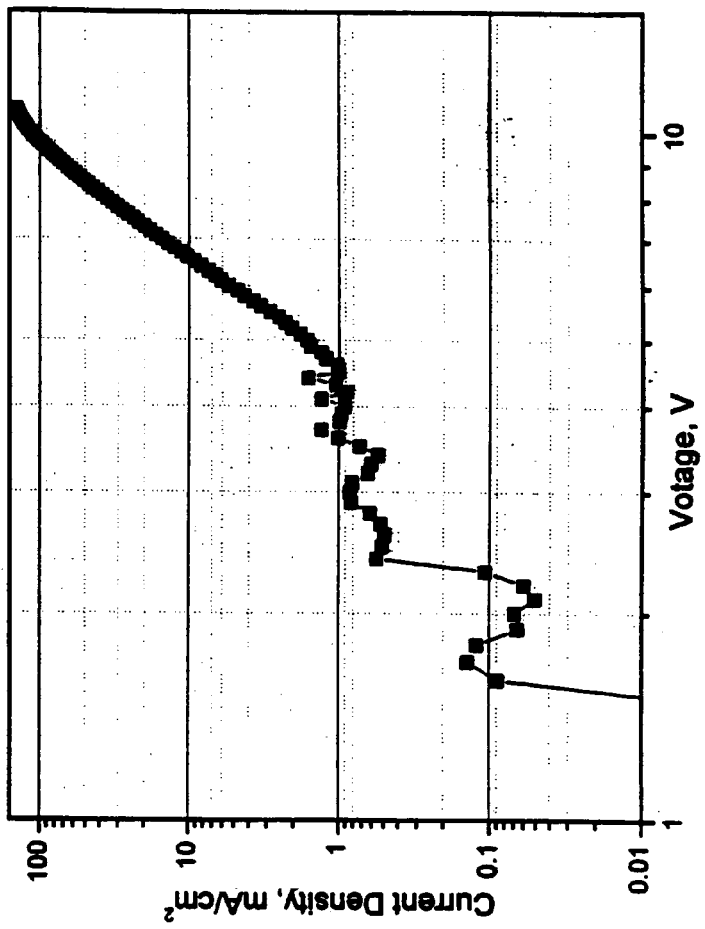
Figure 12:
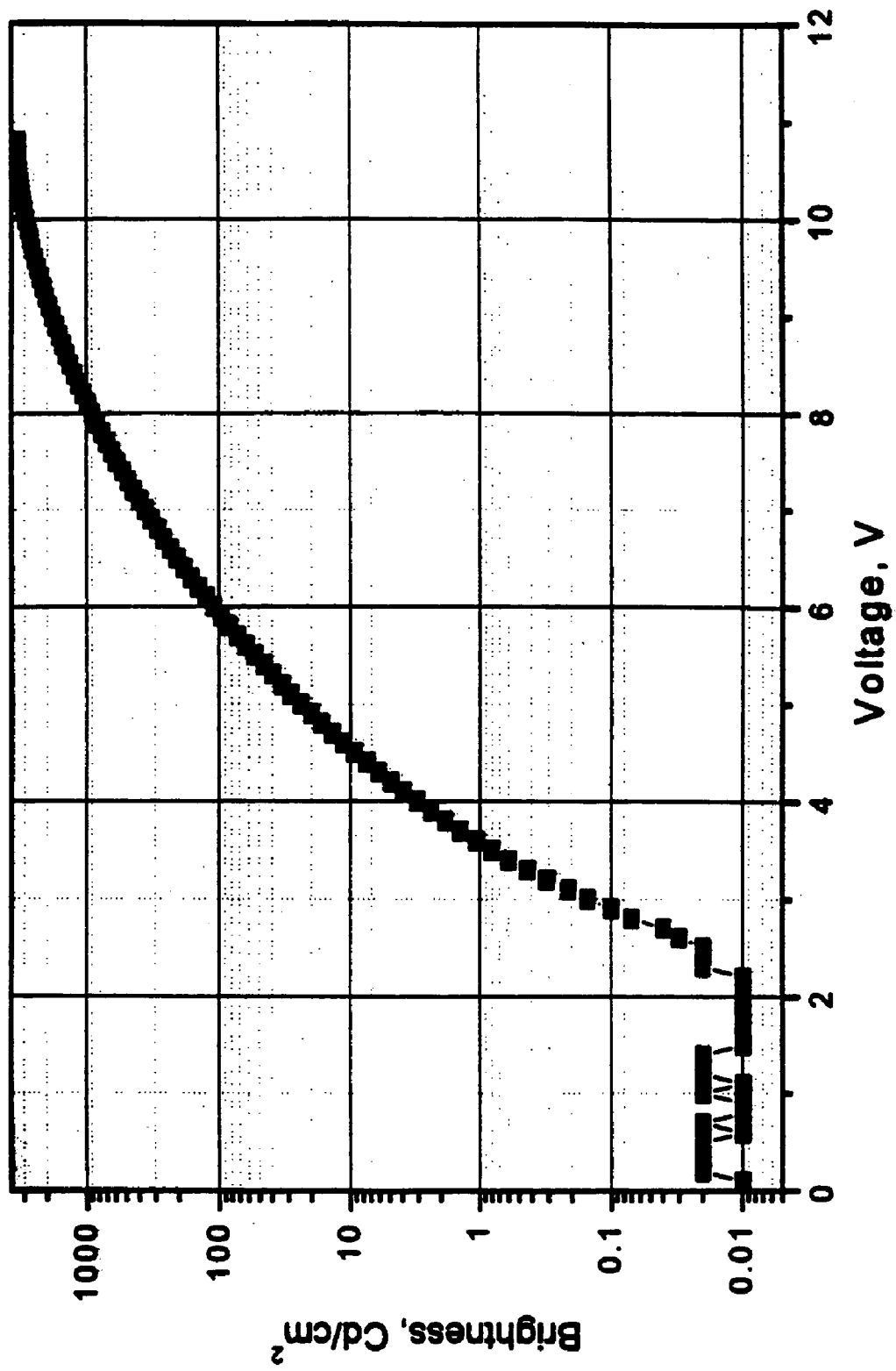
FIG. 12 shows a luminance v. voltage plot for devices of the structure ITO/Co(Ppz)$_3$(400 Å)/Ga(pma)$_3$(100 Å)/Alq$_3$ (500 Å)/MgAg(1000 Å)/Ag.
Figure 13:
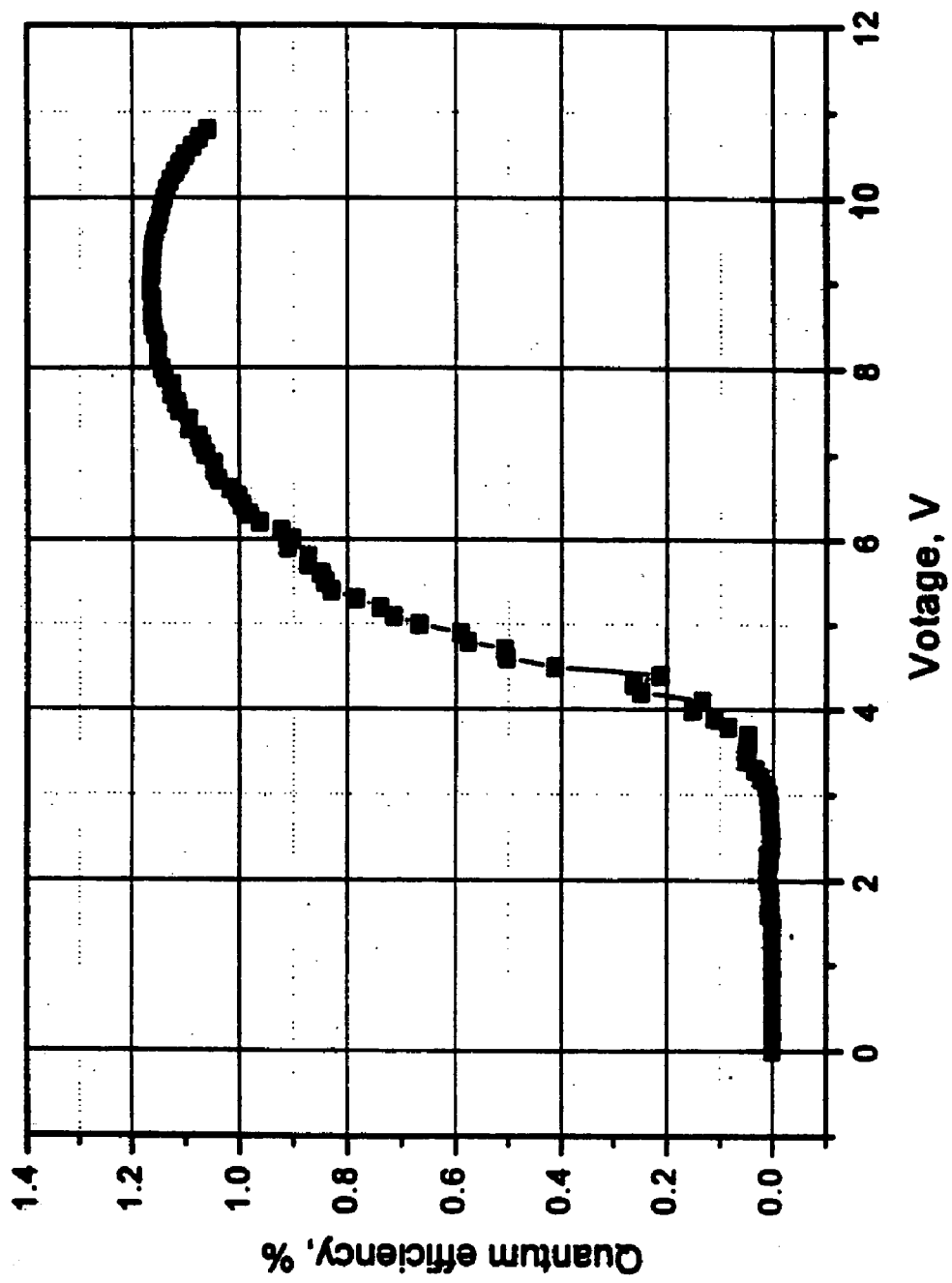
FIG. 13 shows an external quantum efficiency v. voltage plot for devices of the structure ITO/Co(Ppz)$_3$(400 Å)/Ga (pma)$_3$(100 Å)/Alq$_3$(500 Å)/MgAg(1000 Å)/Ag.
Figure 14:
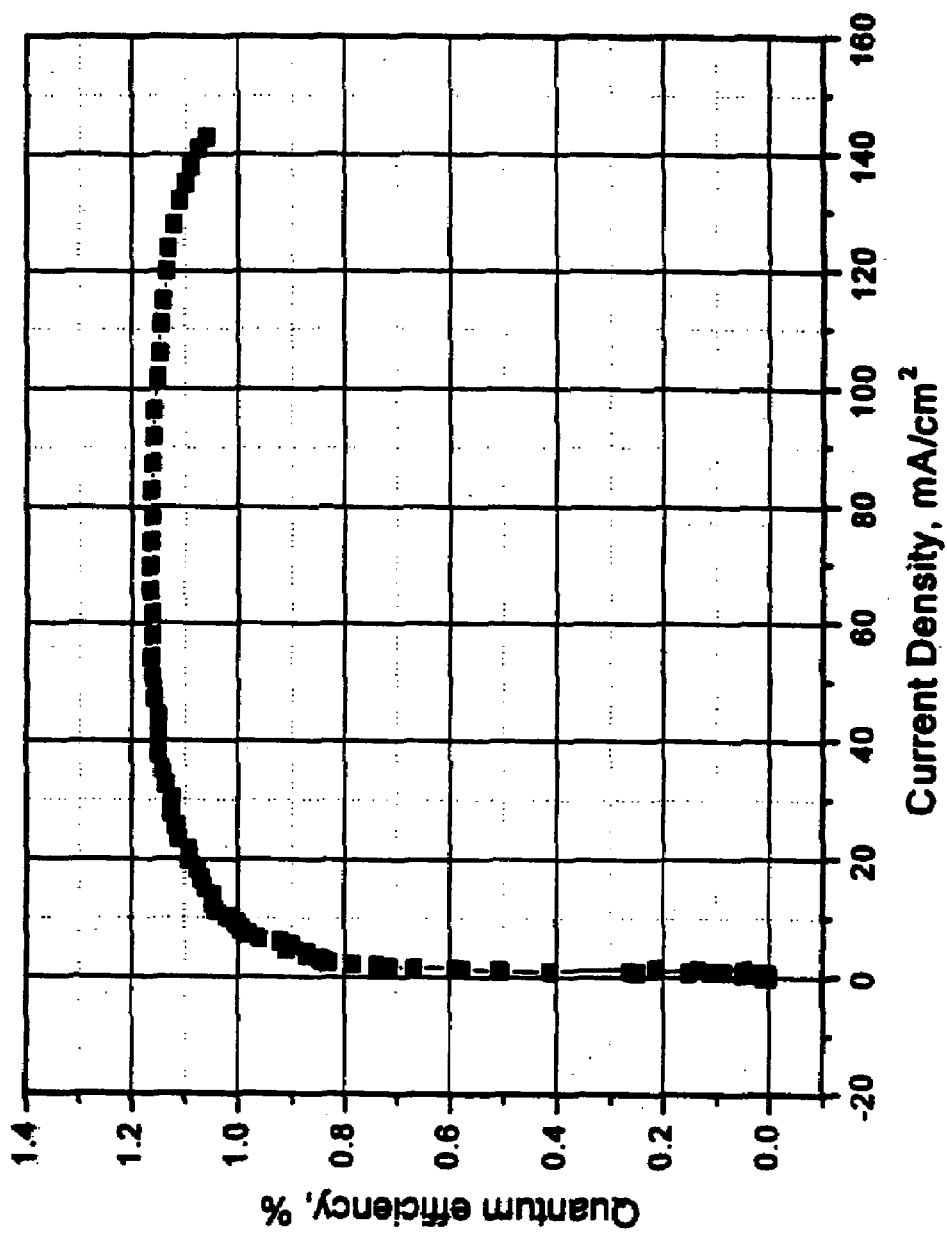
FIG. 14 shows a quantum efficiency v. current density plot for devices having the structure ITO/Co(Ppz)$_3$(400 Å)/Ga (pma)$_3$(100 Å)/Alq$_3$(500 Å)/MgAg(1000 Å)/Ag.
Figure 15A:
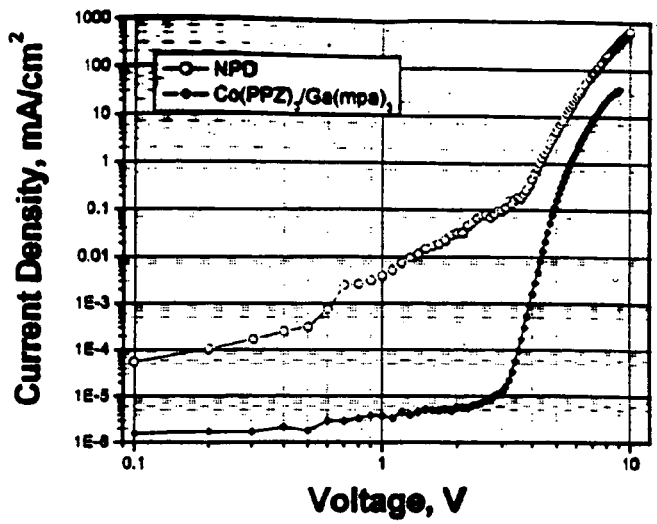
FIGS. 15A-15B show current density v. voltage and brightness v. voltage plots for devices having the structure ITO/HTL(500 Å)/CBP:Irppy(6%)(200 Å)/BCP(150 Å)Alq$_3$ (200 Å)/LiF/Al.
Figure 15B:
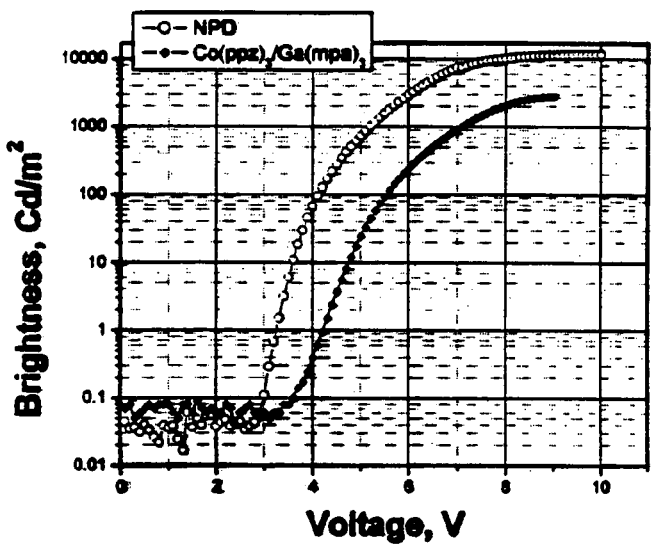
Figure 16A:
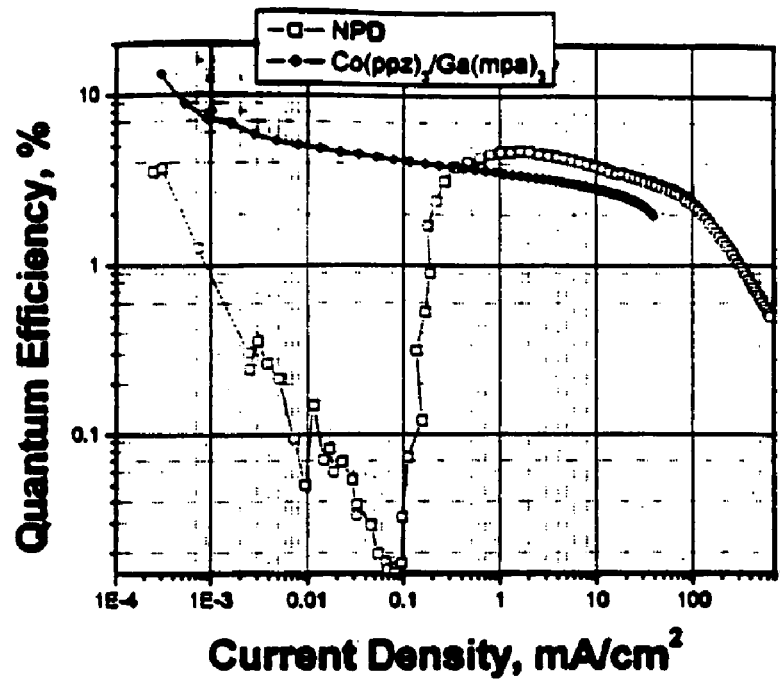
FIGS. 16A-16B show quantum efficiency v. current density and emission spectrum plots for devices having the structure ITO/HTL(500 Å)/CBP:Irppy(6%)(200 Å)/BCP (150 Å)Alq$_3$(200 Å)/LiF/Al.
Figure 16B:
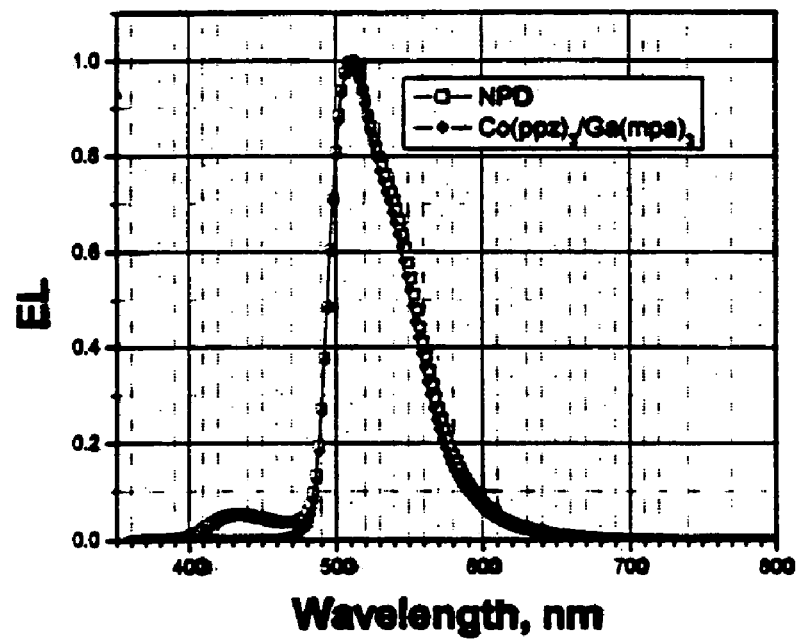
Figure 17:
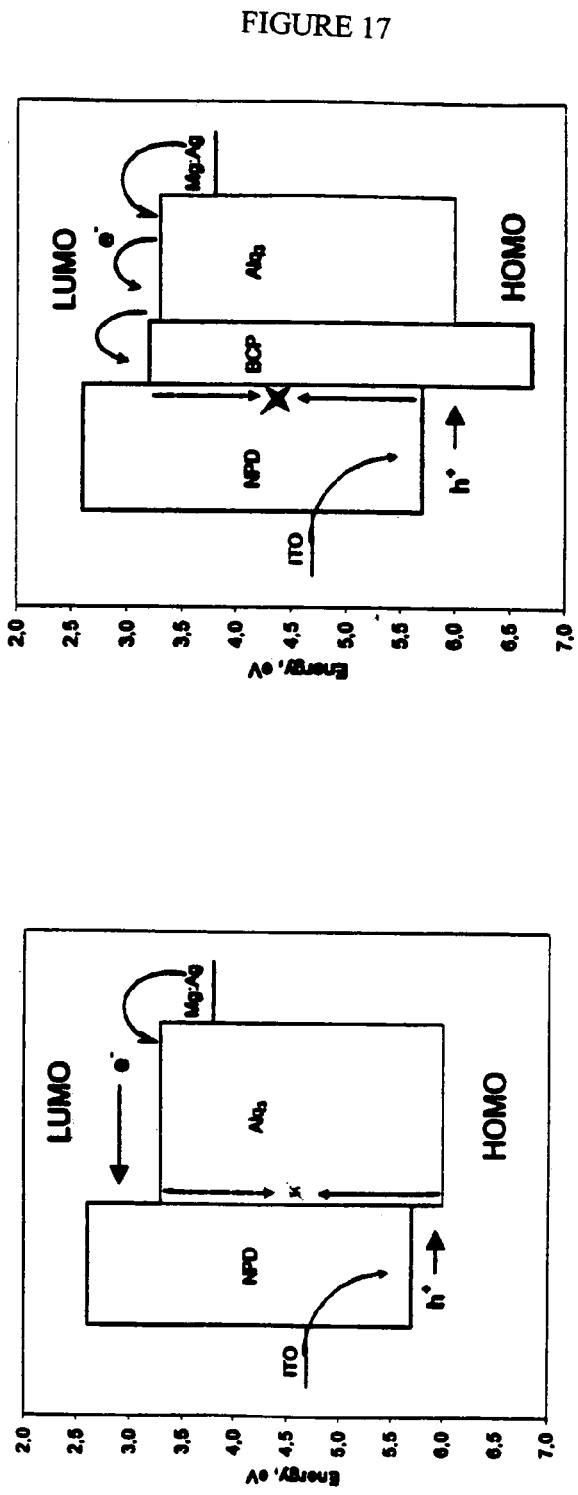
FIG. 17 illustrates benefits of hole blocking layers in light emitting devices.
Figure 18:
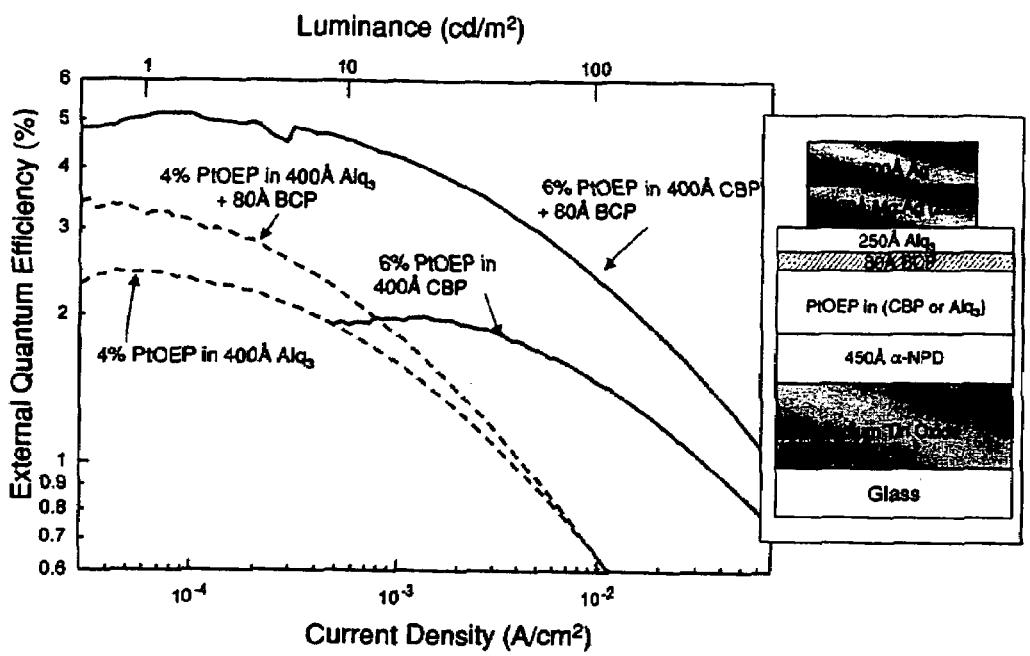
FIG. 18 further illustrates benefits of hole blocking layers in light emitting devices.
Figure 18:
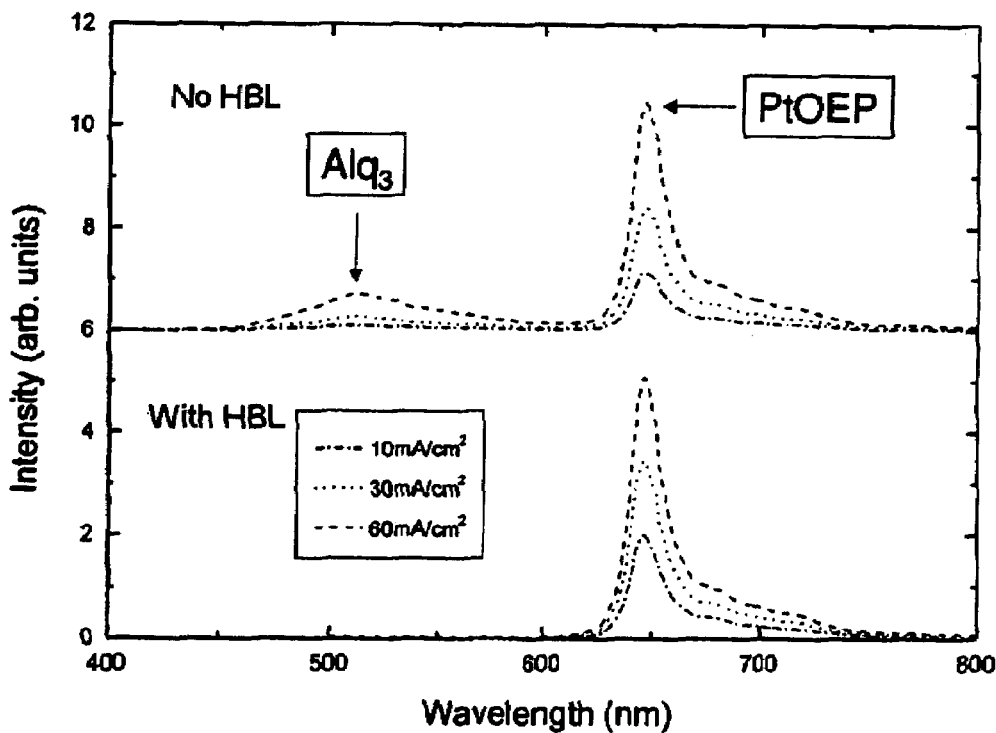
Figure 19:
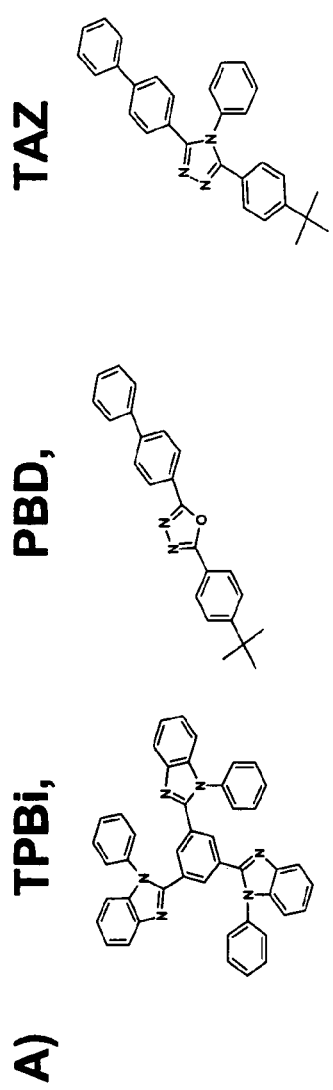
FIG. 19 shows conventional hole blocking layer materials used in light emitting devices.
Figure 19:
Figure 20:
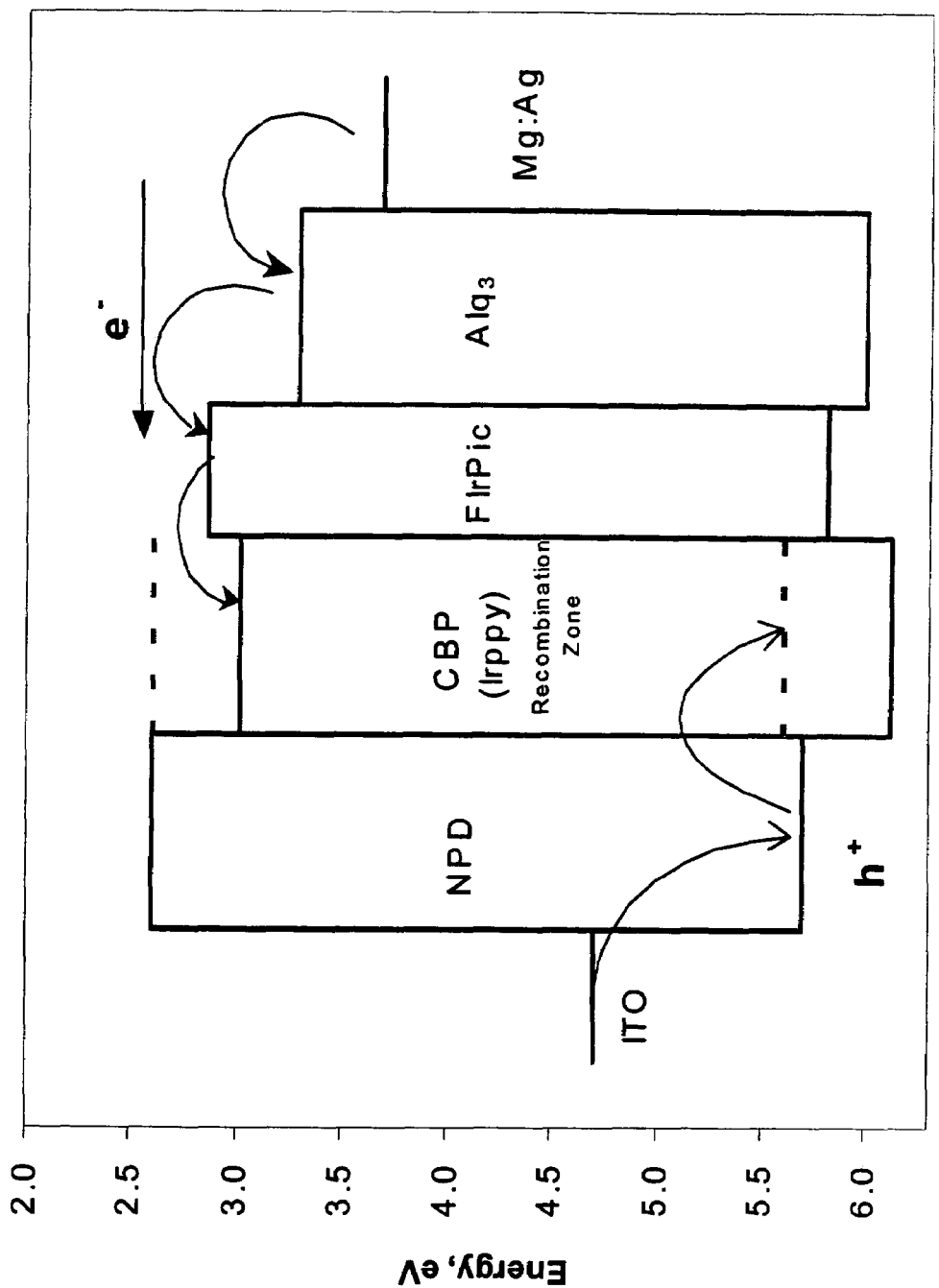
FIG. 20 illustrate the advantages of metal complexes as hole blocking layer material.
Figure 21:
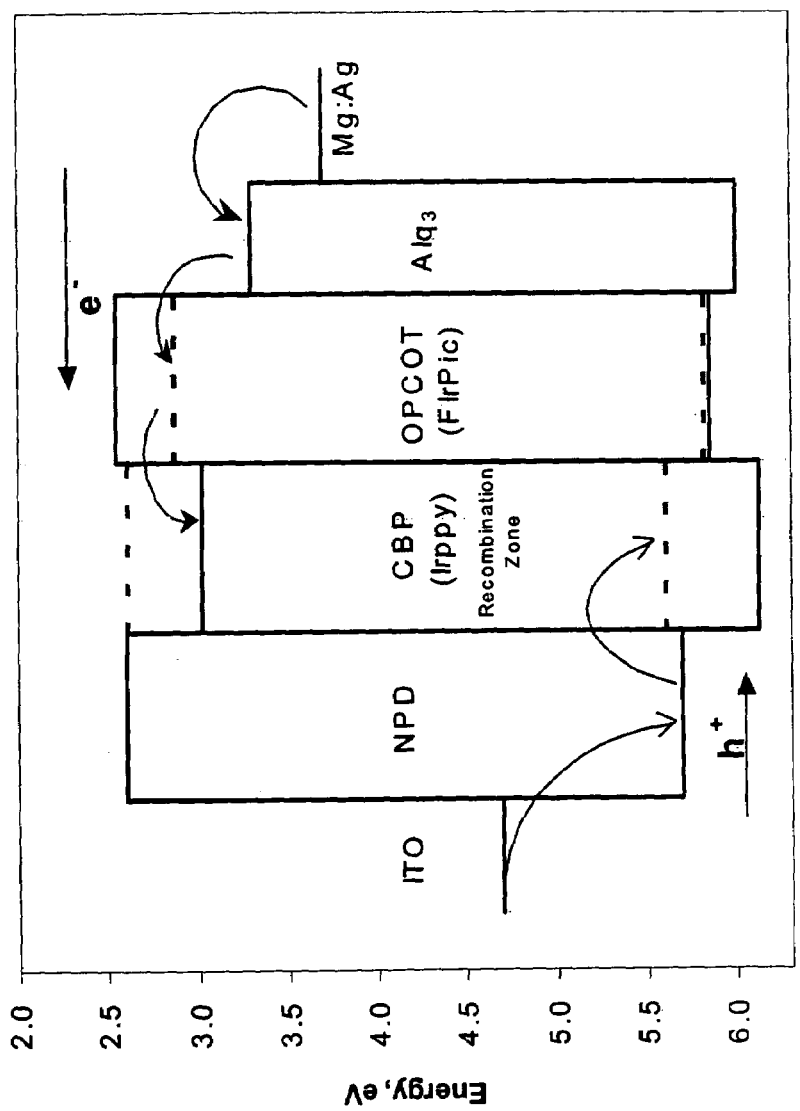
FIG. 21 illustrates a host-dopant approach to constructing hole blocking layers.
Figure 22:
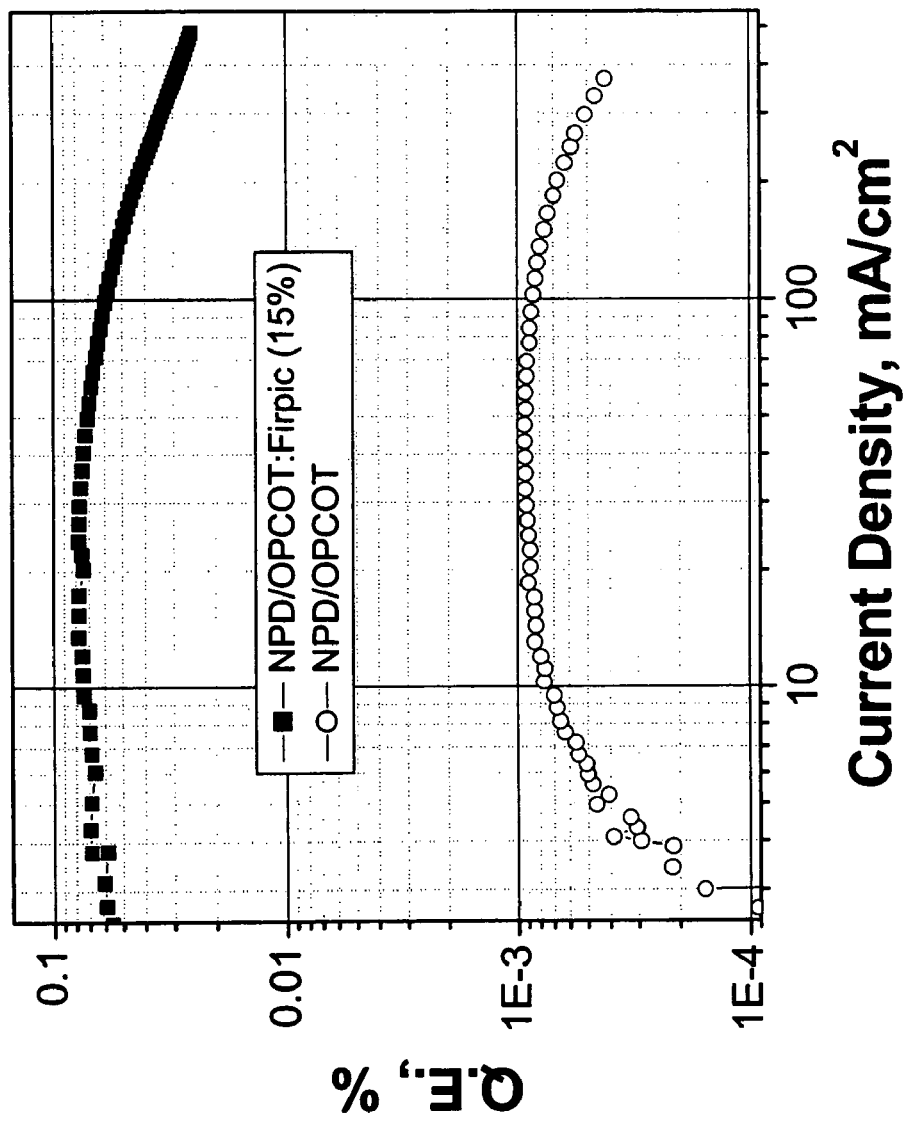
FIG. 22 illustrates devices having a hole blocking layer with a host-dopant structure.
Figure 23:
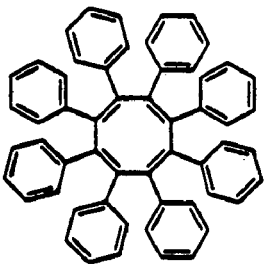
FIG. 23 shows materials for hosts and dopants in hole blocking layers.
Figure 23:
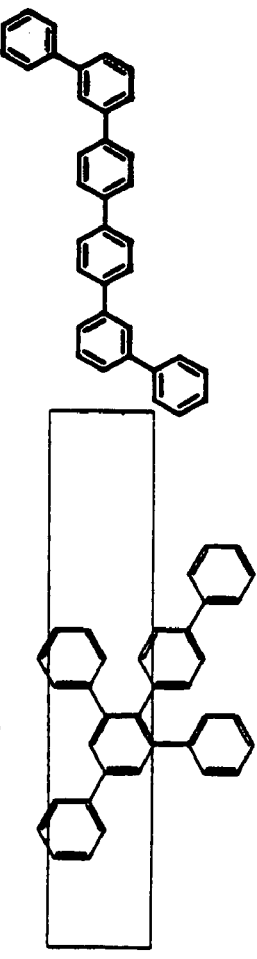
Figure 23:
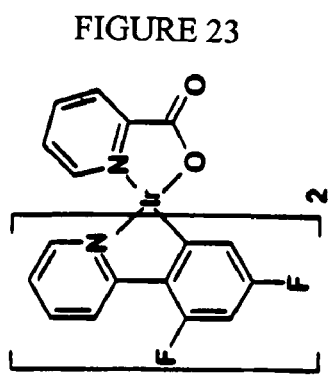
Figure 24:
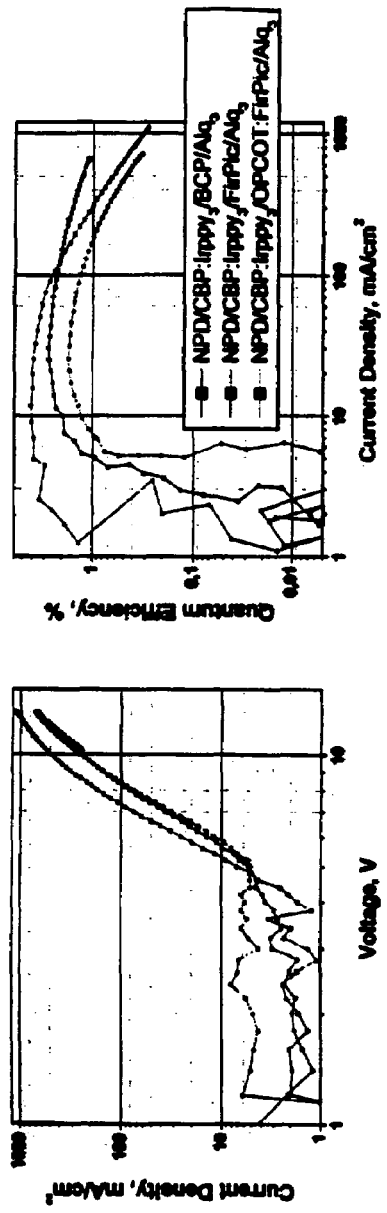
FIG. 24 compares properties of devices having different hole blocking layers comprising FIrpic.
Figure 24:
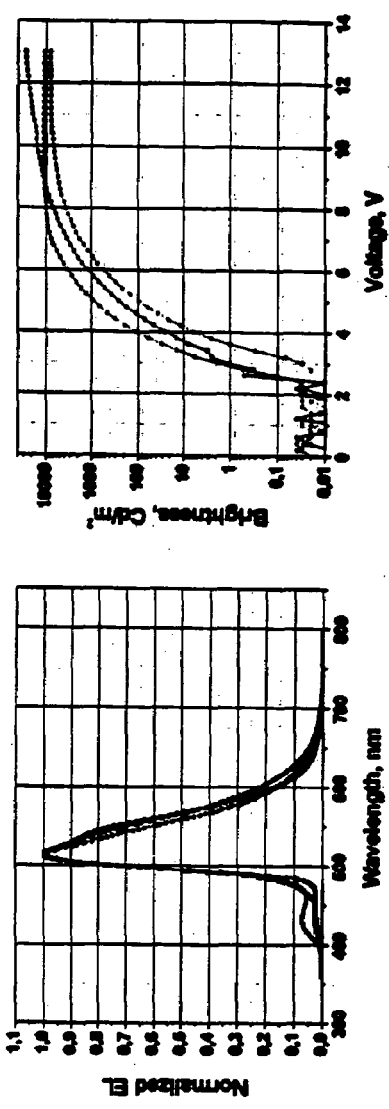
Figure 25:
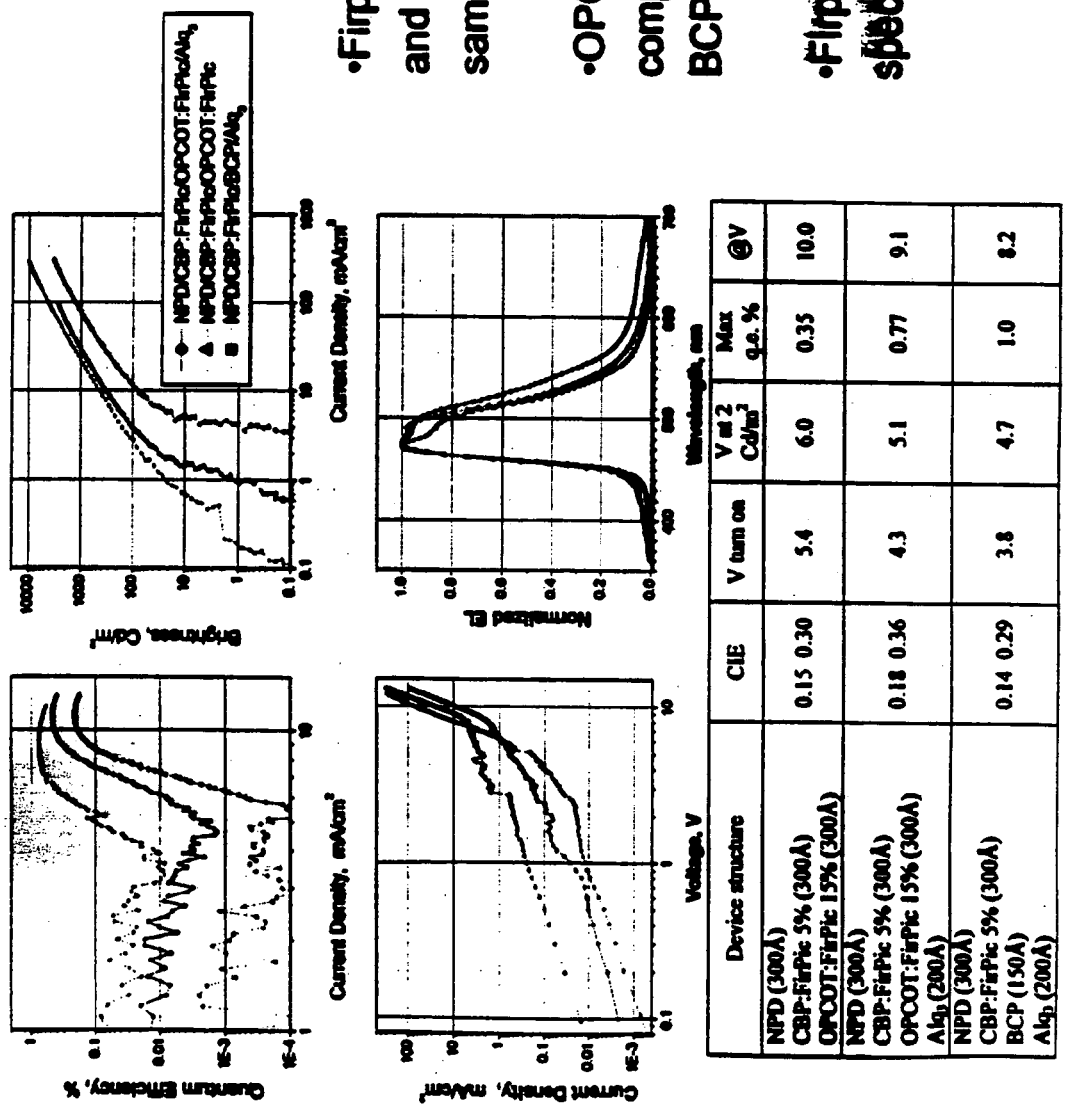
FIG. 25 compares properties of different devices having an emissive layer and a hole blocking layer both comprising FIrpic.
Figure 26:
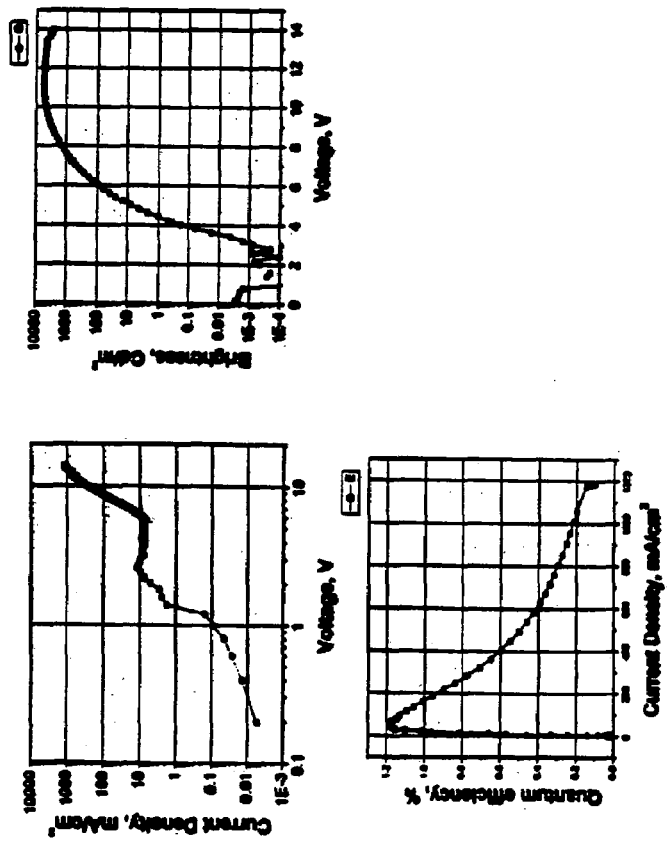
FIG. 26 compares properties of devices having different HBLs.

As used herein, the terms "low" and "deep," in reference to molecular orbital energies, are used interchangeably. Lower and deeper generally describe molecular orbitals residing at a lower, or more stable, energy level. Ionization of electrons from deeper orbitals requires more energy than ionization of electrons in shallower, or higher, orbitals. Thus, although the deeper orbitals are said to be lower, they are often referred to numerically by higher numbers. For example, a molecular orbital residing at 5.5 eV is lower (deeper) than a molecular orbital residing at 2.5 eV. Similarly, the terms "shallow" and "high" in reference to orbital energy levels, refer to orbitals at less stable energies. These terms are well known to those skilled in the art.

As used herein, the term "adjacent," in reference to layers of light emitting devices, refers to layers having contacting sides. For example, a first layer and a second layer that are adjacent to one another describe, for example, contacting layers where one side of one layer is in contact with one side of the other layer.

As used herein, the term "gap" or "band-gap" generally refers to an energy difference, such as, for example, between a HOMO and a LUMO. A "wider gap" refers to an energy difference that is greater than for a "narrower gap" or "smaller gap." A "carrier gap" refers to the energy difference between the HOMO and LUMO of a carrier.

The present invention is directed to, inter alia, light emitting devices comprising one or more layers that in turn comprise at least one metal complex. Devices, as such, may have higher efficiencies and higher stability as compared with devices having traditional organic blocking layers.

The light emitting devices of the present invention are typically layered structures that electroluminesce when a voltage is applied across the device. Typical devices are structured so that one or more layers are sandwiched between a hole injecting anode layer and an electron injecting cathode layer. The sandwiched layers have two sides, one facing the anode and the other facing the cathode. These sides are referred to as the anode side and the cathode side, respectively. Layers are generally deposited on a substrate, such as glass, on which either the anode layer or the cathode layer may reside. In some embodiments, the anode layer is in contact with the substrate. In many cases, for example, when the substrate comprises a conductive or semi-conductive material, an insulating material can be inserted between the electrode layer and the substrate. Typical substrate materials, that may be rigid, flexible, transparent, or opaque, include glass, polymers, quartz, sapphire, and the like.

Hole transporting layers are placed adjacent to the anode layer to facilitate the transport of holes. In some embodiments, a hole injecting layer for enhancing hole injection, sometimes referred to as a hole injecting enhancement layer, may be placed adjacent to the anode, between the anode and the HTL. Materials suitable for the HTL include any material that is known by one skilled in the art to function as such. Suitable materials are typically easy to oxidize and include triaryl amines, such as N,N'-diphenyl-N,N'-bis(3-methylphenyl)1-1'biphenyl-4,4'diamine (TPD), 4,4'-bis[N-(1-naphthyl)-N-phenyl-amino]biphenyl (α-NPD), 4,4'-bis[N-(2-naphthyl)-N-phenyl-amino]biphenyl (β-NPD), and the like. Metal complexes may also be used in HTLs. Some suitable metal complexes are described, for example, in Application Ser. No. 60/283,814, filed Apr. 13, 2001, which is incorporated herein by reference in its entirety. Similarly, ETLs are situated adjacent to the cathode layer to facilitate transport of electrons. An electron injecting enhancement layer can optionally be placed adjacent to an ETL or cathode layer. Materials suitable for the ETL include any materials known in the art to function as such. Typical ETL materials are relatively easy to reduce and can include, for example, aluminum tris(8-hydroxyquinolate) (Alq$_3$), carbazoles, oxadiazoles, triazoles, thiophene, oligothiophene, and the like. HTL and ETL carrier layers can have thicknesses ranging from about 100 to about 1000 Å. Since it is typically the site of exciton formation and luminescence, the EL layer is preferably somewhere between the HTL and ETL. The EL can optionally be in contact with one or both of the HTL and ETL or may be flanked by one or more blocking layers. EL materials can include, for example dye-doped Alq$_3$ and the like. In some embodiments, neat (un-doped) films of luminescent material may be used as the emissive layer. Furthermore, layers can serve dual functions. For example, an ETL or HTL can also function as an EL.

In some embodiments, it is desirable that one or more layers of the device comprise one or more dopants. Emissive dopants (i.e., photoemitting molecules, emitters) can be included in at least one layer, such as for example the EL, for improved efficiency and color tunability. Doped layers usually comprise a majority of host material and minority of dopant. Host material (also referred to as matrix) typically transfers excitons through a non-radiative process to the emissive dopant material, which then emits light of a wavelength characteristic of the dopant, rather than the host.

Dopants can also serve to trap charge. For example, the LUMO levels of the host and dopant can be arranged such that the LUMO level of the dopant is lower than the LUMO level of the host, such that the dopant molecule can act as an electron trap. Similarly, the HOMO levels of the host and dopant can be arranged such that the HOMO level of the dopant is higher than the HOMO level of the host, such that the dopant molecule would act as a hole trap. In addition, one or more dopants, referred to as transfer dopants, can be used to facilitate the transfer of energy from the host to the emissive dopant. For example, cascade doping can be used, which involves the non-radiative transfer of excitons from a molecule of the host through one or more transfer dopants to the emissive dopant. These intermediate transfers can be by Förster transfer, Dexter transfer, hole trapping or electron trapping that eventually leads to the formation of an exciton on the transfer dopant or the emissive dopant, or by any other suitable mechanism.

Dopants can be present in the host material in quantities ranging, for example, from about 0.1% to about 50%, from about 1% to about 20%, or from 1% to about 10% by weight. A level of about 1% by weight of doping is preferred for emissive dopants in host material. Alternatively, in some embodiments, levels of dopant result in an average intermolecular distance between dopant molecules of about the Förster radius of the dopant, such as, for example, from about 20 to about 40 Å, or from about 25 to about 35 Å, or about 30 Å. Emissive dopants can include any compound that is capable of photoemission. Emissive dopants include fluorescent organic dyes, such as laser dyes, as known and used in the art. Preferred emissive dopants include phosphorescent metal complexes, such as the Ir, Pt, and other heavy metal complexes disclosed in U.S. Pat. Nos. 6,303,238, 6,830,828, and U.S. Provisional Patent Application No. 60/283,814, filed Apr. 13, 2001, each of which is incorporated herein by reference in its entirety.

In some embodiments, devices of the present invention comprise at least one blocking layer. Blocking layers (BLs) function to confine holes, electrons, and/or excitons to specific regions of the light emitting devices. For example, device efficiency can be increased when excitons are confined to the EL and/or when holes and electrons are prevented from migrating out of the EL. Blocking layers can serve one or more blocking functions. For example, a hole blocking layer can also serve as an exciton blocking layer. In some embodiments, the hole blocking layer does not simultaneously serve as an emissive layer in devices of the present invention. Although a blocking layer can include compounds that are capable of emitting, emission can occur in a separate emissive layer. Thus, in preferred embodiments, the blocking layer does not luminesce. Blocking layers can be thinner than carrier layers. Typical blocking layers have thicknesses ranging from about 50 Å to about 1000 Å, or from about 50 Å to about 750 Å, or from about 50 Å to about 500 Å. Additionally, blocking layers preferably comprise compounds other than BAlq.

Hole blocking layers (HBLs) are typically comprised of materials that have difficulty acquiring a hole. For example, hole blocking materials can be relatively difficult to oxidize. In most instances, hole blocking materials are more difficult to oxidize than an adjacent layer for transporting holes. A material that is more difficult to oxidize than another material typically possesses a lower HOMO energy level. For example, holes originating from the anode and migrating into an EL can be effectively blocked from exiting the EL (on the cathode side) by placing a blocking layer of material adjacent to the EL on the cathode side of the device. The blocking layer preferably has a HOMO energy level lower than the HOMO energy levels of the EL. Larger differences in HOMO energy levels correspond to better hole blocking ability. The HOMO of the materials of the blocking layer are preferably at least about 50, 100, 200, 300, 400, 500 meV (milli-electronvolts) or more deeper than the HOMO level of an adjacent layer in which holes are to be confined. In some embodiments, the HOMO of the materials of the blocking layer are at least about 200 meV deeper than the HOMO level of an adjacent layer in which holes are to be confined.

In some devices of the invention, the layer in which holes are to be confined can comprise more than one material, such as a host material (matrix) and a dopant. In this case, a HBL preferably has a HOMO energy level that is lower (deeper) than the material of the adjacent layer which carries the majority of positive charge (i.e., the material with the highest (shallowest) HOMO energy level). For example, an emissive layer can comprise a host material having a deeper HOMO energy level than the dopant. In this case, the dopant acts as a trap for holes and can be the principle hole transporter of the emissive layer. Thus, in such embodiments, the HOMO energy of the dopant is considered when selecting a hole blocking layer. Thus, in some embodiments, the HOMO energy level of the HBL can be higher than the host material and lower than that of the dopant.

Hole blocking layers are also preferably good electron injectors. Accordingly, the LUMO energy level of the HBL is preferably close to the LUMO energy level of the layer in which holes are to be confined. Differences in LUMO energy levels between the two layers in some embodiments can be less than about 500 meV, 200 meV, 100 meV, 50 meV, or even smaller. Hole blocking layers that are also good electron injectors typically have smaller energy barriers to electron injection than for hole leakage. Accordingly, the difference between the LUMO energies of the HBL and the layer in which holes are to be confined (corresponding to an electron injection energy barrier) is smaller than the difference in their HOMO energies (i.e., hole blocking energy barrier).

Conversely, electron blocking layers (EBLs) are comprised of materials that have difficulty acquiring electrons (i.e., are relatively difficult to reduce). In the context of a light emitting device, EBLs are preferably more difficult to reduce than the adjacent layer from which electrons migrate. A material that is more difficult to reduce than another material generally has a higher LUMO energy level. As an example, electrons originating from the cathode and migrating into an EL layer can be blocked from exiting the EL (on the anode side) by placing a blocking layer adjacent to the anode side of the EL where the blocking layer has a LUMO energy level higher than the LUMO energy level of the EL. Larger differences in LUMO energy levels correspond to better electron blocking ability. The LUMO of the materials of the blocking layer are preferably at least about 50 meV, 100 meV, 200 meV, 300 meV, 400 meV, 500 meV or more higher (shallower) than the LUMO level of an adjacent layer in which holes are to be confined. In some embodiments, the LUMO of the materials of the blocking layer can be at least about 200 meV higher (shallower) than the LUMO level of an adjacent layer in which holes are to be confined.

In some embodiments, the layer in which electrons are to be confined can comprise more than one material, such as a host material (matrix) and a dopant. In this case, an EBL preferably has a LUMO energy level that is higher than the material of the adjacent layer which carries the majority of negative charge (e.g., either the host or dopant having the lowest LUMO energy level). For example, an emissive layer can include a host material having a deeper LUMO energy level than the dopant. In this case, the host can be the principle electron transporter of the emissive layer. In such embodiments, the LUMO energy level of the EBL can be higher than the host material and lower than that of the dopant. Similarly, if the dopant served as the primary carrier of electrons, then the EBL preferably has a higher LUMO than the dopant.

Electron blocking layers are also preferably good hole injectors. Accordingly, the HOMO energy level of the EBL is preferably close to the HOMO energy level of the layer in which electrons are to be confined. Differences in HOMO energy levels between the two layers in some embodiments can be less than about 500 meV, 200 meV, 100 meV, 50 meV, or even smaller. Electron blocking layers that are also good hole injectors typically have smaller energy barriers to hole injection than for electron leakage. Accordingly, the difference between the HOMO energies of the EBL and the layer in which electrons are to be confined (corresponding to an hole injection energy barrier) is smaller than the difference in their LUMO energies (i.e., electron blocking energy barrier).

Migration of excitons from the EL to other parts of the devices can be blocked with materials that have difficulty acquiring excitons. Transfer of an exciton from one material to another may be prevented when the receiving material has a wider (greater) optical gap than the exciton donating material. For example, excitons can be substantially confined to the EL layer of a device by placing, adjacent to the EL layer, an exciton blocking layer having a wider optical gap than the materials comprising the EL layer. Exciton blocking layers can also be placed on either side of the EL. Exciton blocking layers can also serve as HBLs or EBLs, depending on the energy levels of the HOMO or LUMO of the exciton blocking material compared with those of adjacent layers (as discussed above). Additionally, exciton blocking layers can be good electron or hole injectors when either the HOMO or LUMO energy level of the exciton blocking layer is close in energy to the respective HOMO or LUMO energy level of an adjacent layer. For example, in devices having an exciton blocking layer and an emissive layer, the exciton blocking layer can have a HOMO energy level that is less than about 500, 200, or 100 meV from the HOMO energy level of said emissive layer. Conversely, the exciton blocking layer can have a LUMO energy level that is less than about 500, 200, 100 meV from the LUMO energy level of said emissive layer.

According to some embodiments of the present invention, blocking layers can also comprise dopants. As an example, the blocking layer can be comprised of a wide band-gap matrix (host) material doped with a smaller band-gap dopant. Depending on the matrix and dopant combination, the effective LUMO energy of the blocking layer can be lowered by the presence of dopant, consequently improving the electron conduction and injection properties of a hole blocking layer. Conversely, the effective HOMO energy of the blocking layer can be raised by the presence of dopant, thereby improving hole injection properties. As an example, in some embodiments, HBLs comprise a wide band-gap matrix doped with a smaller band-gap material where the deep HOMO energy level of the matrix serves to prevent transport of holes and the relatively shallow LUMO level of the dopant favors electron injection. In some embodiments of the invention, the matrix can comprise a substantially conjugated organic molecule, such as, for example, octaphenyl cyclooctatetraene (OPCOT), oligophenylenes, such as hexaphenyl, and other similar materials having a wide band-gap. Suitable matrix band gap values can be at least about 3 eV, but can also be at least about 2.5 eV, 3.0 eV, 3.3 eV, 3.5 eV or higher. Dopant is preferably a metal complex. Doping levels can range from about 1% to about 50%, or more preferably from about 5% to about 20%, or even more preferably from about 10 to about 15% by weight. An example of a suitable metal complex used as a dopant for blocking layers is bis(2-(4,6-difluorophenyl)pyridyl-N, C2') iridium(III) picolinate (FIrpic). An example of hole blocking layer comprising a matrix doped with a metal complex is OPCOT doped with 15% by weight of FIrpic (OPCOT: FIrpic(15%)). For example, OPCOT:FIrpic can effectively confine holes to an emissive layer comprising CBP doped with $Ir(ppy)_3$ (tris(2-phenylpyridyl-N, C2')iridium(III), Irppy) because the HOMO of OPCOT is lower than the HOMO of Irppy and the LUMO of FIrpic is higher than the LUMO of CBP (see, e.g., Examples 7 and 8).

Metal complexes used in the devices of the present invention include any metal coordination complex comprising at least one metal atom and at least one ligand. Metal complexes can be charged or uncharged; however, uncharged complexes are more amenable to the thin layer deposition techniques used in OLED fabrication. Metal complexes are preferably stable to both one electron oxidation and one electron reduction processes. Redox-stable complexes can be identified, for example, by cyclic voltammetry (e.g., identification of reversible redox events). Additionally, such metal complexes often have low reorganizational energy barriers associated with oxidation and reduction. Accordingly, complexes having low reorganizational energy barriers show little structural difference between resting state, oxidized, and reduced state. Metal complexes typically characterized as having low reorganizational energy barriers include complexes having $d^0$, $d^1$, $d^2$, $d^3$, $d^4$, $d^5$ and $d^6$ electron configurations. For example, octahedral complexes having $d^3$ or $d^6$ metals typically generally have low reorganizational energy barriers. Metal complexes in which redox events affect predominantly non-bonding molecular orbitals (such as the $t_{2g}$ set in octahedral transition metal complexes) generally have low reorganizational energy barriers, since little structural change is seen in the ligand set upon oxidation or reduction. Reorganizational energy associated with redox events can also be modulated by the ligand set. For example, multidentate ligands can structurally impose a certain coordination geometry in metal complexes. Relatively rigid tridentate, tetradentate, hexadentate ligands, and the like can constrain coordination geometry such that redox events do not result in significant structural reorganization. Additionally, metal complexes that are coordinatively saturated, such as six-coordinate complexes, which are less likely to have significant structural change associated with oxidation or reduction, are also preferred. Four-coordinate complexes can also be suitable and can include both tetrahedral and square-planar complexes as well as others. Octahedral complexes are also suitable due to their propensity for forming glassy films. Metal complexes comprising aromatic ligands may help facilitate redox processes, preferably in those instances where redox events are largely centered on the ligand. Furthermore, metal complexes comprising heavy metals are preferred over those with lighter metals for their greater thermal stability. For example, complexes comprising second and third row transition metals are preferred.

Any metal atom, in any of its accessible oxidation states, is suitable in metal complexes, including main group, transition metals, lanthanides, actinides, alkaline earth, and alkali metals. Transition metals include Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, and Hg. Main group metals include Al, Ga, Ge, In, Sn, Sb, Tl, Pb, Bi, and Po. In some embodiments, metals having an atomic number greater than about 13, 36, or 54 are preferred.

Metal complexes can include any suitable ligand system. Suitable ligands can be monodentate, bidentate, multidentate, π-bonding, organic, inorganic, charged, or uncharged. Further, ligands preferably comprise one or more heteroatoms through which the metal atom is coordinated, although organometallic compounds comprising coordinating carbon are also suitable and also considered as metal complexes. Coordinating heteroatoms of the ligands can include oxygen, nitrogen, sulphur, phosphorus, and the like. Nitrogen-containing ligands can include amines, nitrenes, azide, diazenes, triazenes, nitric oxide, polypyrazolylborates, heterocycles, such as 2,2'-bipyridine (bpy), 1,10-phenanthroline, terpyridine (trpy), pyridazine, pyrimidine, purine, pyrazine, pyridine, 1,8-napthyridine, pyrazolate, imidazolate, and macrocycles including those with and without a conjugated π system, and the like. Phosphorus-containing ligands typically include phosphines and the like. Oxygen-containing ligands include water, hydroxide, oxo, superoxide, peroxide, alkoxides, alcohols, aryloxides, ethers, ketones, esters, carboxylates, crown ethers, β-diketones, carbamate, dimethylsulfoxide, and oxo anions, such as carbonate, nitrate, nitrite, sulfate, sulfite, phosphate, perchlorate, molybdate, tungstate, oxalate and related groups. Sulfur-containing ligands can include hydrogen sulfide, thiols, thiolates, sulfides, disulfides, thioether, sulfur oxides, dithiocarbamates, 1,2-dithiolenes, and the like. Ligands comprising coordinating carbon atoms can include cyanide, carbon disulfide, alkyl, alkenes, alkynes, carbide, cyclopentadienide, and the like. Halides can also serve as ligands. Metal complexes containing these and other ligands are described in detail in Cotton and Wilkinson, *Advanced Inorganic Chemistry*, Fourth Ed., John Wiley & Sons, New York, 1980, which is incorporated herein by reference in its entirety. Additional suitable ligands are described in U.S. Provisional Application No. 60/283,814, filed Apr. 13, 2001 and U.S. Pat. No. 6,830,828, each of which is incorporated herein by reference in its entirety.

Ligands, especially neutral ligands, can be further derivatized with one or more substituents, including anionic groups, to fully or partially neutralize any positive formal charge associated with the metal atoms of the metal complexes. Suitable anionic substitutents can include carbonate, nitrate, nitrite, sulfate, sulfite, phosphate, and the like.

Metal complexes suitable for hole blocking layers can include, inter alia, complexes of Os, Ir, Pt, and Au, including those described in application Ser. No. 08/980,986, filed Dec. 1, 1997; U.S. Pat. Nos. 6,303,238, 09/883,734, filed Jun. 18, 2001; U.S. Pat. Nos. 6,830,828; and 60/283,814, filed Apr. 13, 2001, each of which is herein incorporated by reference in its entirety. An example of a metal complex.

suitable in hole blocking layers is bis(2-(4,6-difluorophenyl)pyridyl-N, C2')iridium(III) picolinate (FIrpic), the structure of which is shown below.

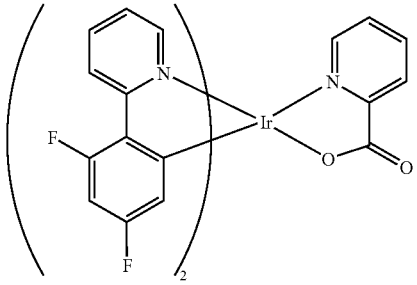

bis(2-(4,6-difluorophenyl)pyridyl-N, C2')iridium(III) picolinate (FIrpic)

Metal complexes suitable for electron blocking layers include those that are relatively difficult to reduce (i.e., high LUMO energy level). Suitable metal complexes include metal complexes of the formula:

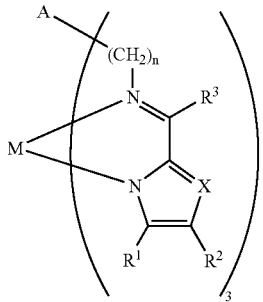

M is a metal atom;

X is N or CX' where X' is H, $C_1$-$C_{20}$ alkyl, $C_2$-$C_{40}$ mono- or poly alkenyl, $C_2$-$C_{40}$ mono- or poly alkynyl, $C_3$-$C_8$ cycloalkyl, aryl, heteroaryl, aralkyl, heteroaralkyl, or halo;

A is CH, CX', N, P, P(=O), aryl or heteroaryl;

each $R^1$ and $R^2$ is, independently, H, $C_1$-$C_{20}$ alkyl, $C_2$-$C_{40}$ alkenyl, $C_2$-$C_{40}$ alkynyl, $C_3$-$C_8$ cycloalkyl, aryl, aralkyl, or halo; or $R^1$ and $R^2$, together with the carbon atoms to which they are attached, link to form a fused $C_3$-$C_8$ cycloalkyl or aryl group;

$R^3$ is H, $C_1$-$C_{20}$ alkyl, $C_2$-$C_{40}$ alkenyl, $C_2$-$C_{40}$ alkynyl, $C_3$-$C_8$ cycloalkyl, aryl, aralkyl, or halo; and n is 1 to 5.

In some preferred embodiments, M is a trivalent metal, such as Al or Ga. Variable A may preferably be $CR^3$ or N. $R^1$ and $R^2$, in some embodiments, join to form a fused aromatic ring, such as phenyl or pyridyl. A particularly suitable compound of the above formula is gallium(III)tris[2-(((pyrrole-2-yl)methylidene)amino)ethyl]amine (Ga(pma)$_3$) shown below.

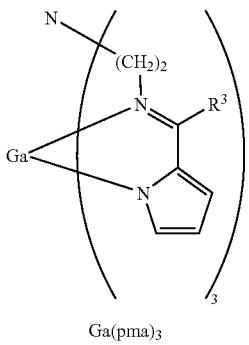

Ga(pma)$_3$

Other suitable metal complexes may have the formula

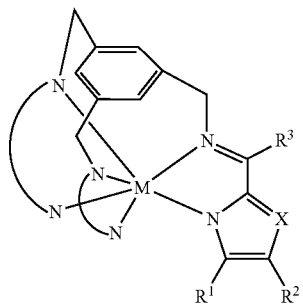

wherein:

M is a metal atom;

is N or CX' where X' is H, $C_1$-$C_{20}$ alkyl, $C_2$-$C_{40}$ mono- or poly alkenyl, $C_2$-$C_{40}$ mono- or poly alkynyl, $C_3$-$C_8$ cycloalkyl, aryl, heteroaryl, aralkyl, heteroaralkyl, or halo;

each $R^1$ and $R^2$ is, independently, H, $C_1$-$C_{20}$ alkyl, $C_2$-$C_{40}$ alkenyl, $C_2$-$C_{40}$ alkynyl, $C_3$-$C_8$ cycloalkyl, aryl, aralkyl, or halo; or $R^1$ and $R^2$, together with the carbon atoms to which they are attached, link to form a fused $C_3$-$C_8$ cycloalkyl or aryl group; and $R^3$ is H, $C_1$-$C_{20}$ alkyl, $C_2$-$C_{40}$ alkenyl, $C_2$-$C_{40}$ alkynyl, $C_3$-$C_8$ cycloalkyl, aryl, aralkyl, or halo.

As referred to throughout the present disclosure, alkyl groups include optionally substituted linear and branched aliphatic groups. Cycloalkyl refers to cyclic alkyl groups, including, for example, cyclohexyl and cyclopentyl, as well as heterocycloalkyl groups, such as pyranyl, and furanyl groups. Cycloalkyl groups may be optionally substituted. Alkenyl groups may be substituted or unsubstituted and comprise at least one carbon-carbon double bond. Alkynyl groups may be substituted or unsubstituted and comprise at least one carbon-carbon triple bond. Aryl groups are aromatic and substituted aromatic groups having about 3 to about 50 carbon atoms, including, for example, phenyl. Heteroaryl groups are aromatic or substituted aromatic groups having from about 3 to about 50 carbon atoms and comprising at least one heteroatom. Examples of heteroaryl groups include pyridyl and imidazolyl groups. Aralkyl groups can be substituted or unsubstituted and have about 3 to about 30 carbon atoms, and include, for example, benzyl.

Heteroaralkyl include aralkyl groups comprising at least one heteroatom. Halo includes fluoro, chloro, bromo, and iodo. Substituted groups may contain one or more substituents. Suitable substituents may include, for example, H, $C_1$-$C_{20}$ alkyl, $C_2$-$C_{40}$ alkenyl, $C_2$-$C_{40}$ alkynyl, $C_3$-$C_8$ cycloalkyl, $C_3$-$C_8$ heterocycloalkyl, aryl, heteroaryl, aralkyl, heteroaralkyl, halo, amino, azido, nitro, carboxyl, cyano, aldehyde, alkylcarbonyl, aminocarbonyl, hydroxyl, alkoxy, and the like. Substituents can also be electron-withdrawing groups and electron-donating groups.

Metal complexes suitable for exciton blocking layers include those that have relatively wide optical gaps. Metal complexes suitable for the preparation of hole blocking layers include high energy absorbers and emitters, such as, for example, blue emitters. Preferred metal complexes include those in which the metal has a closed valence shell (no unpaired electrons). As a result, many preferred metal complexes for preparing exciton blocking layers are colorless, since their optical gap energy falls outside the visible range. Further, complexes having heavy metals are preferred. For example, heavy metals of the second and third row transition series tend to have larger optical gaps due to a stronger ligand field. Examples of suitable metal complexes for exciton blocking layers include, inter alia, complexes of Os, Ir, Pt, and Au, such as those described in application Ser. No. 08/980,986, filed Dec. 1, 1997, Ser. No. 09/883,734, filed Jun. 18, 2001, and Ser. No. 60/283,814, filed Apr. 13, 2001, each of which is herein incorporated by reference in its entirety. In some embodiments, metal complexes suitable for exciton blocking layers include FIrpic, Ga(pma)$_3$, and related compounds. Other suitable complexes include those described in Example 1.

The HOMO and LUMO energy levels for OLED materials, can be measured, or estimated, in several ways known in the art. The two common methods for estimating HOMO energy levels include solution electrochemistry, such as cyclic voltammetry, and ultraviolet photoelectron spectroscopy (UPS). Two methods for estimating LUMO levels include solution electrochemistry and inverse photoemission spectroscopy. As discussed above, alignment of the HOMO and LUMO energy levels of adjacent layers can control the passage of holes and electrons between the two layers.

Cyclic voltammety is one of the most common methods for determining oxidation and reduction potentials of compounds. This technique is well known to those skilled in the art, and a simple description of this process follows. A test compound is dissolved along with a high concentration of electrolyte. Electrodes are inserted and the voltage scanned in either the positive or negative direction (depending on whether an oxidation or reduction is being performed). The presence of a redox reaction is indicated by current flowing through the cell. The voltage scan is then reversed and the redox reaction is reversed. The reference can be an external electrode, such as Ag/AgCl or SCE, or it can be an internal one, such as ferrocene, which has a known oxidation potential. The latter is often preferred for organic solvents, since the common reference electrodes are water based. A useful parameter that may come from cyclic voltammetry is the carrier gap. If both the reduction and oxidation are reversible, one can determine the energy difference between the hole and the electron (i.e. taking an electron out of the HOMO versus putting one into the LUMO). This value can be used to determine the LUMO energy from a well defined HOMO energy. This method for determining redox potentials and reversiblity of redox events using cyclic voltammetry is well known in the art.

UPS is an alternative technique for determining absolute binding energies in the solid state. Although solution electrochemistry is typically adequate for most compounds, and for giving relative redox potentials, the measurements taken in the solution phase can differ from values in the solid phase. A preferred method of estimating HOMO energies in the solid state is UPS. This is a photoelectric measurement, where the solid is irradiated with UV photons. The energy of the photons are gradually increased until photogenerated electrons are observed. The onset of ejected electrons gives the energy of the HOMO. The photons at that energy have just enough energy to eject an electron from the top of the filled levels. UPS provides HOMO energy level values in eV relative to vacuum which corresponds to the binding energy for the electron.

Inverse photoemission may be used to directly estimate LUMO energy levels. This technique involves pre-reducing the sample and then probing the filled states to estimate the LUMO energies. More specifically, a material is injected with electrons which then decay into unoccupied states and emit light. By varying the energy of the incoming electrons and the angle of the incident beam, electronic structure of a material can be studied. Methods of measuring LUMO energy levels using inverse photoemission are well known to those skilled in the art.

Optical gap values can be determined from the intersection of the normalized absorption and emission spectra. For molecules that have very little structural rearrangement in going from the ground state to the excited, such that the gap between the absorption and emission $\lambda_{max}$ values is rather small, the intersection energy is a good estimate of the optical gap (the 0-0 transition energy). Thus, the optical gap roughly corresponds to the HOMO-LUMO gap, and such estimation may be adequate for ideal systems. However, if the shift between the absorption and emission maxima is large (Stokes shift) the optical gap can be more difficult to determine. For example, if there is a structural rearrangement in the excited state or the measured absorption does not represent the lowest energy excited state, then there can be a substantial error. Thus, for the selection of potential exciton blocking materials, the edge of the absorption band of the material is preferably used to obtain a value for its optical gap. In this way, device layers comprising materials having absorption band energies higher than for adjacent layers may serve as effective exciton blocking layers. For example, if an exciton approaches a layer in a device having a higher energy absorption edge than the material containing the exciton, the probability that the exciton will be transferred into the higher energy material is low. For molecules emitting from triplet excited states, the absorption edge is a preferred estimate for optical gap, since the intersystem crossing leads to a very large Stokes shift.

Light emitting devices of the present invention can be fabricated by a variety of techniques well known to those skilled in the art. Small molecule layers, including those comprised of neutral metal complexes, can be prepared by vacuum deposition, organic vapor phase deposition (OVPD), such as disclosed in U.S. Pat. No. 6,337,102, which is incorporated herein by reference in it its entirety, or solution processing, such as spin coating. Polymeric films can be deposited by spin coating and CVD. Layers of charged compounds, such as salts of charged metal complexes, can be prepared by solution methods such a spin coating or by an OVPD method, such as disclosed in U.S. Pat. No. 5,554,220, which is incorporated herein by refer ence in its entirety. Layer deposition generally, though not necessarily, proceeds in the direction of the anode to the cathode, and the anode typically rests on a substrate. As such, methods of fabricating devices, involving depositing a blocking layer that comprises a metal complex onto a preexisting layer, are also encompassed by the present invention. Preexisting layers include any layer that is designed to be in contact with the blocking layer. In some embodiments, the preexisting layer can be an emissive layer or a HTL. Devices and techniques for their fabrication are described throughout the literature and in, for example, U.S. Pat. Nos. 5,703,436; 5,986,401; 6,013,982; 6,097,147; and 6,166,489. For devices from which light emission is directed substantially out of the bottom of the device (i.e., substrate side), a transparent anode material, such as ITO, may be used as the bottom electron. Since the top electrode of such a device does not need to be transparent, such a top electrode, which is typically a cathode, may be comprised of a thick and reflective metal layer having a high electrical conductivity. In contrast, for transparent or top-emitting devices, a transparent cathode may be used, such as disclosed in U.S. Pat. Nos. 5,703,436 and 5,707,745, each of which is incorporated herein by reference in its entirety. Top-emitting devices may have an opaque and/or reflective substrate, such that light is produced substantially out of the top of the device. Devices can also be fully transparent, emitting from both top and bottom.

Transparent cathodes, such as those used in top-emitting devices preferably have optical transmission characteristics such that the device has an optical transmission of at least about 50%, although lower optical transmissions can be used. In some embodiments, devices include transparent cathodes having optical characteristics that permit the devices to have optical transmissions of at least about 70%, 85%, or more. Transparent cathodes, such as those described in U.S. Pat. Nos. 5,703,436 and 5,707,745, typically comprise a thin layer of metal, such as Mg:Ag, with a thickness, for example, that is less than about 100 Å. The Mg:Ag layer can be coated with a transparent, electrically-condutive, sputter-deposited, ITO layer. Such cathodes are often referred to as compound cathodes or as TOLED (transparent-OLED) cathodes. The thickness of the Mg:Ag and ITO layers in compound cathodes may each be adjusted to produce the desired combination of both high optical transmission and high electrical conductivity, for example, an electrical conductivity as reflected by an overall cathode resistivity of about 30 to 100 ohms per square. However, even though such a relatively low resistivity can be acceptable for certain types of applications, such a resistivity can still be somewhat too high for passive matrix array OLED pixels in which the current that powers each pixel needs to be conducted across the entire array through the narrow strips of the compound cathode.

Structures of light emitting devices are often referred to by a sequential listing of layer materials separated by slashes. For example, a device having an anode layer adjacent to a hole transporting which is adjacent to an emissive layer which is adjacent to an electron blocking layer which is adjacent to a cathode layer can be written as anode/HTL/EL/ETL/cathode. As such, devices of the present invention can include the substructures HTL/EL/HBL, HTL/EBL/EL, HTL/EBL/ETL, and others. Some preferred structures of the present invention include anode/HTL/EL/HBL/ETL/cathode and anode/HTL/EBL/EL/ETL/cathode.

Light emitting devices of the present invention can be used in a pixel for a display. Virtually any type of display can incorporate the present devices. Displays can include computer monitors, televisions, personal digital assistants, printers, instrument panels, bill boards, and the like. In particular, the present devices can be used in heads-up displays because they can be substantially transparent when not in use.

As those skilled in the art will appreciate, numerous changes and modifications can be made to the preferred embodiments of the invention without departing from the spirit of the invention. It is intended that all such variations fall within the scope of the invention.

Throughout this specification various groupings are employed to conveniently describe constituent variables of compounds and groups of various related moieties. It is specifically intended that each occurrence of such groups throughout this specification include every possible subcombination of the members of the groups, including the individual members thereof.

It is intended that each of the patents, applications, and printed publications mentioned in this patent document be hereby incorporated by reference in their entirety.

EXAMPLES

Example 1

Iridium Complexes Suitable for Blocking Layers According to the Present Invention The table given below has the HOMO energies, based on UPS, the carrier gaps (cyclic voltammetry) and the LUMO energies. Absorption band edges are also given. All of the complexes have fully reversible oxidation and reduction waves. The structures of the complexes are shown in FIG. 1.

TABLE 1

Properties of Ir complexes

| cpd | oxididation (V, vs. Fc/Fc+) | reduction (V, vs. Fc/Fc+) | carrier gap (V) | HOMO (eV from UPS) | LUMO (eV, HOMO - carrier gap)) | Optical gap (eV) |
| --- | --- | --- | --- | --- | --- | --- |
| mer-Irppy | 0.25 | −2.5 | 2.75 | 5.23 | 2.48 | 2.5 |
| fac-Irppy | 0.32 | −2.69 | 3.01 | 5.36 | 2.35 | 2.59 |
| BTPIr | 0.36 | −2.29 | 2.65 | 5.14 | 2.49 | 2.35 |
| PQIr | 0.43 | −2.45 | 2.88 | 5.41 | 2.53 | 2.18 |
| BSNIr | 0.55 | −2.18 | 2.73 | 5.24 | 2.51 | 2.32 |
| BTIr | 0.56 | −2.15 | 2.71 | 5.45 | 2.74 | 2.17 |

Example 2

Synthesis of 2-(4,6-difluorophenyl)pyridine

The compound 2-(4,6-difluorophenyl)pyridine was prepared by Suzuki coupling of 4,6-difluoropheyl boronic acid (Frontier Chemical) with 2-bromopyridine (Aldrich) in 1,2-dimethoxyethane using a Pd(OAc)$_2$/PPh$_3$ catalyst and K$_2$CO$_3$ base according to *Synlett,* 1999, 1, 45, which is incorporated herein by reference in its entirety.

Example 3

Synthesis of fac-tris(2-(4,6-difluorophenyl)pyridinato-N,C2')iridium(III)

Ir(acac)$_3$ was treated with 6 eq of 2-(4,6-difluorophenyl)pyridine in glycerol at 180 C under an inert gas atmosphere for 16 hours. After cooling to room temperature, water was added to the reaction mixture in order to precipitate the crude product. The solvent was removed under reduced pressure and the crude yellow product was washed with methanol. The crude product was flash chromatographed using a silica:dichloromethane column to yield ca. 75% of the pure yellow fac-tris(2-(4,6-difluorophenyl)pyridinato-N, C2')iridium(III) product after solvent evaporation and drying.

Example 4

Synthesis of [(2-(4,6-difluorophenyl)pyridyl)$_2$IrCl]$_2$

All procedures involving IrCl$_3$-H$_2$O or any other Ir(III) species were carried out in inert gas atmosphere. A mixture of IrCl$_3$.nH$_2$O and 4 eq of 2-(4,6-difluorophenyl)pyridine in 2-ethoxyethanol was heated at 130° C. for 16 hr. the product was isolated by addition of water followed by filtration and methanol wash giving 90% yield.

Example 5

Synthesis of bis(2-(4,6-difluorophenyl)pyridyl-N, C2')iridium(III) picolinate (FIrpic)

The complex [(2-(4,6-difluorophenyl)pyridyl)$_2$IrCl]$_2$ was treated with 2 eq of picolinic acid in refluxing 1,2-dichloroethane under inert gas for 16 hours. After cooling to room temperature, the solvent was removed under reduced pressure and the crude yellow product was washed with methanol to remove any unreacted picolinic acid. The crude product was flash chromatographed using a silica:dicloromethane column to yield ca. 75% of the pure yellow product after solvent evaporation and drying.

Example 6

Synthesis of Ga(III)tris[2-(((pyrrole-2-yl)methylidene)amino) ethyl]amine (Ga(pma)$_3$)

The ligand [(((pyrrole-2-yl)methylidene)amino)ethyl]amine was prepared by adding a methanolic solution of pyrrole-2-carboxaldehyde (1.430 g, 15 mmol, 100 mL) to a methanolic solution of tris(2-aminoethyl)amine (0.720 g, 5 mmol, 10 mL). The resulting yellow solution was stirred at room temperature for 30 min. A methanolic solution of gallium(III) nitrate hydrate (1.280 g, 5 mmol, 150 mL) was added to the ligand solution and stirred at room temperature for 30 min. The solution was filtered and left to stand at ambient temperature until crystallization occurred. The crude material was then sublimed at 235° C.

Example 7

Light Emitting Devices Having a Blocking Layer Comprising a Wide Band-Gap Matrix Doped with a Metal Complex Devices have been fabricated that comprise hole blocking layers which consist of FIrpic doped into a wide gap matrix. These doped layers comprise less of the Ir complex than a layer made of pure Ir complex and may have an advantage in long term stability. The details of this process are described below.

The HBL was tested in blue phosphorescent OLEDs with the structure ITO/NPD(300 Å)/CBP:FirPic(5%)(300 Å)/HBL/ETL/Mg:Ag/Ag, where ITO is indium-tin oxide, NPD is 4,4'bis[N-(1-naphthyl)-N-phenyl-amino]biphenyl, CBP is 4,4'-N,N'-dicarbazole biphenyl, FIrPic is bis(2-(4,6-difluorophenyl)pyridyl-N,C2')iridium(III) picolinate. As a hole-blocking matrix OPCOT (octaphenyl cyclooctatetraene C$_8$Ar$_8$, wide band gap (3.3 eV) material) and hexaphenyl compounds were used in which FIrPic was introduced as both a blue phosphorescence emitter (in CBP emissive layer) and as a dopant (in OPCOT or hexaphenyl) in the HBL.

It was demonstrated that doping OPCOT with 15% FIrPic greatly enhances the electron conduction and electron injection properties of the HBL as compared with the non-doped OPCOT (by lowering LUMO level energy). Thus, OPCOT:FirPic can be used as an efficient HBL. The efficiency of the devices were comparable to BCP HBL OLEDs (2,9-dimethyl-4,7-diphenyl-1,10-phenanthroline, a material conventionally used as a HBL). Moreover, OPCOT:FirPic is not only an efficient hole-blocker, but is also a very good electron-injection material, since the lower LUMO level of FIrPic as compared to the workfunction of magnesium, makes it easy to accept electrons from the cathode.

By choosing an appropriate dopant with certain HOMO and LUMO energies levels it is possible to tune electron conductivity and other OLED properties (turn on voltage, quantum efficiency and etc).

Example 8

Devices According to the Present Invention

The tables below summarize efficiencies and turn on voltages for devices having a hole blocking material comprising OPCOT doped with FIrpic and comparative devices having traditional hole blocking materials.

TABLE 2

NPD/CBP:FIRPIC/OPCOT/OPCOT:FIRPIC(Alq$_3$)

| Device structure | CIE | Color | V turn on | V at 2 Cd/m$^2$ | Max q.e. % | @V |
|---|---|---|---|---|---|---|
| NPD (300Å) CBP:FirPic 5% (300Å) OPCOT (300Å) | 0.14 0.29 | Aqua | 4.0 | 4.9 | 0.4 | 8.0 |
| NPD (300Å) CBP:FirPic 5% (300Å) OPCOT (300Å) OPCOT:FirPic 15% (200Å) | 0.14 0.25 | Aqua | 5.3 | 7.0 | 0.81 | 11.4 |
| NPD (300Å) CBP:FirPic 5% (300Å) OPCOT (300Å) Alq$_3$ (200Å) | 0.15 0.34 | Aqua-Greenish | 5.0 | 6.4 | 0.61 | 10.8 |

TABLE 3

NPD/CBP:FIRPic/HBL/ETL

| Device structure | CIE | Color | V turn on | V at 2 Cd/m$^2$ | Max q.e. % | @V |
|---|---|---|---|---|---|---|
| NPD (300Å) CBP:FirPic 5% (300Å) OPCOT:FirPic 15% (300Å) | 0.15 0.30 | Aqua | 5.4 | 6.0 | 0.35 | 10.0 |
| NPD (300Å) CBP:FirPic 5% (300Å) OPCOT:FirPic 15% (300Å) Alq$_3$ (200Å) | 0.18 0.36 | Aqua | 4.3 | 5.1 | 0.77 | 9.1 |
| NPD (300Å) CBP:FirPic 5% (300Å) BCP (150Å) Alq$_3$ (200Å) | 0.14 0.29 | Aqua | 3.8 | 4.7 | 1.0 | 8.2 |

TABLE 4

NPD/CBP:Irppy$_3$/HBL/Alq$_3$

| Device structure | λ max., nm | Color | V turn on | V at 100 Cd/m$^2$ | Max q.e. % | @V |
|---|---|---|---|---|---|---|
| NPD (400Å) CBP:Irppy$_3$ (6%) (200Å) BCP (150Å) Alq$_3$ (200Å) | 516 | Green | 3.5 | 4.0 | 2.7 | 7.0 |
| NPD (400Å) CBP:Irppy$_3$ (6%) (200Å) FirPic (150Å) Alq$_3$ (200Å) | 518 | Green | 2.9 | 3.7 | 4.1 | 5.4 |
| NPD (400Å) CBP:Irppy$_3$ (6%) (200Å) OPCOT:FirPic (15%) (150Å) Alq$_3$ (200Å) | 514 | Green | 4.0 | 4.5 | 1.7 | 7.0 |

TABLE 5

NPD/CBP:Firpic/BCP/Alq$_3$ v. NPD/CBP:Firpic/Firpic/Alq$_3$

| Device structure | λ max., nm | Color | V turn on | V at 2 Cd/m$^2$ | Max q.e. % | @V |
|---|---|---|---|---|---|---|
| NPD (400Å) CBP:Firpic (300Å) BCP (150Å) Alq$_3$ (200Å) | 476 500 | Aqua | 4.0 | 4.6 | 0.68 | 6.8 |
| NPD (200Å) CBP:Firpic (300Å) Firpic (150Å) Alq$_3$ (200Å) | 476 500 | Aqua | 4.0 | 4.2 | 0.61 | 7.4 |

What is claimed is:

1. A light emitting device, comprising an emissive layer and at least one blocking layer, wherein said blocking layer comprises at least one transition metal complex, and wherein said at least one transition metal complex is an organometallic complex having a coordinating carbon.

2. The light emitting device of claim 1, wherein said blocking layer does not electroluminesce in said device.

3. The light emitting device of claim 1, wherein said blocking layer is a hole blocking layer.

4. The light emitting device of claim 1, wherein said blocking layer is an exciton blocking layer.

5. The light emitting device of claim 1, wherein said blocking layer consists essentially of said metal complex.

6. The light emitting device of claim 1, wherein said transition metal is a second or third row transition metal.

7. The light emitting device of claim 1, wherein said transition metal is iridium.

8. The light emitting device of claim 1, wherein said metal complex is bis(2-(4,6-difluorophenyl)pyridyl-N,C2')iridium (III) picolinate.

9. A light emitting device, comprising an emissive layer and at least one blocking layer, wherein said blocking layer comprises at least one metal complex, comprising a main group metal atom having an atomic number greater than 13, and wherein said at least one metal complex is an organometallic complex having a coordinating carbon.

10. The light emitting device of claim 9, wherein said blocking layer does not electroluminesce in said device.

11. The light emitting device of claim 9, wherein said blocking layer is a hole blocking layer.

12. The light emitting device of claim 9, wherein said blocking layer is an exciton blocking layer.

13. The light emitting device of claim 9, wherein said blocking layer consists essentially of said metal complex.

14. The light emitting device of claim 9, wherein said main group metal atom is a third, fourth, or fifth main group metal atom.

15. The light emitting device of claim 9, wherein said main group metal atom is gallium.

16. A light emitting device, comprising an emissive layer and at least one blocking layer, wherein said blocking layer comprises at least one metal complex comprising a main group metal atom, and wherein said at least one metal complex is a six-coordinate organometallic complex having a coordinating carbon.

17. A light emitting device, comprising an emissive layer and a blocking layer, wherein said blocking layer comprises a wide band-gap organic matrix into which an organometallic complex having a metal-coordinating carbon is doped.

18. A light emitting device, comprising an emissive layer and a hole blocking layer, each of said layers having an anode side and a cathode side, wherein said cathode side of said emissive layer is in contact with said anode side of said hole blocking layer, wherein said hole blocking layer has a lower HOMO energy level than the HOMO energy level of said emissive layer, and comprises at least one transition metal complex, wherein said at least one transition metal complex is an organometallic complex having a coordinating carbon.

19. The light emitting device of claim 18, wherein the magnitude of the difference between the LUMO energy levels of said hole blocking layer and said emissive layer is less than the magnitude of the difference between said HOMO energy levels of said hole blocking layer and said emissive layer.

20. The light emitting device of claim 18, wherein said hole blocking layer consists essentially of said metal complex.

21. The light emitting device of claim 18, wherein said emissive layer comprises a host material doped with an emitter.

22. The light emitting device of claim 21, wherein said hole blocking layer comprises a wide band-gap organic matrix doped with said metal complex.

23. The light emitting device of claim 22, wherein said metal complex has a smaller band-gap than said matrix.

24. The light emitting device of claim 23, wherein the LUMO energy level of said metal complex is less than about 200 meV from the LUMO energy level of said emissive layer.

25. The light emitting device of claim 21, wherein said emitter is a metal complex.

26. A light emitting device, comprising an emissive layer and a hole blocking layer, each of said layers having an anode side and a cathode side, wherein said cathode side of said emissive layer is in contact with said anode side of said hole blocking layer, wherein said hole blocking layer has a lower HOMO energy level than the HOMO energy level of said emissive layer and comprises at least one metal complex comprising a main group metal atom having an atomic number greater than 13, wherein said at least one transition metal complex is an organometallic complex having a coordinating carbon.

27. A light emitting device, comprising an emissive layer and a hole blocking layer, each of said layers having an anode side and a cathode side, wherein said cathode side of said emissive layer is in contact with said anode side of said hole blocking layer, wherein said hole blocking layer has a lower HOMO energy level than the HOMO energy level of said emissive layer and comprises at least one six-coordinate transition metal complex, wherein said at least one transition metal complex is an organometallic complex having a coordinating carbon.

28. A light emitting device, comprising an emissive layer and an exciton blocking layer, wherein said emissive layer is in contact with said exciton blocking layer, wherein said exciton blocking layer has a wider optical gap than the optical gap of said emissive layer, and wherein said exciton blocking layer comprises at least one organometallic complex having a coordinating carbon.

29. The light emitting device of claim 28, wherein said exciton blocking layer has a HOMO energy level that is less than about 200 meV from the HOMO energy level of said emissive layer.

30. The light emitting device of claim 28, wherein said exciton blocking layer has a LUMO energy level that is less than about 200 meV from the LUMO energy level of said emissive layer.

31. The light emitting device of claim 28, wherein said exciton blocking layer consists essentially of said metal complex.

32. A light emitting device, having the structure anode/hole transporting layer/emissive layer/hole blocking layer/electron transporting layer/cathode, wherein said hole blocking layer comprises a wide band-gap organic matrix doped with an organometallic complex having a coordinating carbon.

33. A method of confining holes to an emissive layer in a light emitting device, said method comprising providing a device according to claim 18, and applying a voltage across said device.

34. A method of confining excitons to a emissive layer in a light emitting device, said method comprising providing a device according to claim 28, and applying a voltage across said device.

35. The method of claim 34, wherein said blocking layer consists essentially of said metal complex.

36. The method of claim 34, wherein said blocking layer comprises a matrix doped with said metal complex.

37. A method of fabricating a light emitting device, said method comprising depositing a blocking layer onto a preexisting layer, wherein said blocking layer comprises at least one transition metal complex, and wherein said at least one transition metal complex is an organometallic complex having a coordinating carbon, and wherein said device is a device according to claim 1.

38. The method of claim 37, wherein said metal complex is Flrpic.

39. A pixel, comprising the light emitting device of claim 1.

40. A pixel, comprising the light emitting device of claim 9.

41. A pixel, comprising the light emitting device of claim 16.

42. A pixel, comprising the light emitting device of claim 17.

43. An electronic display, comprising the light emitting device of claim 1.

44. An electronic display, comprising the light emitting device of claim 9.

45. An electronic display, comprising the light emitting device of claim 16.

46. An electronic display, comprising the light emitting device of claim 17.

47. The light emitting device of claim 1, wherein said at least one transition metal complex comprises a nitrogen containing ligand selected from the group consisting of amines, nitrenes, azide, diazenes, triazenes, nitric oxide, polypyrazolylborates, 2,2'-bipyridine, 1,10-phenanthroline, terpyridine pyridazine, pyrimidine, purine, pyrazine, pyridine, 1,8-napthyridine, pyrazolate and imidazolate.

* * * * *